(12) United States Patent
Koyanagi et al.

(10) Patent No.: US 11,671,071 B2
(45) Date of Patent: *Jun. 6, 2023

(54) ACOUSTIC WAVE DEVICE, ACOUSTIC WAVE DEVICE PACKAGE, RADIO-FREQUENCY FRONT-END CIRCUIT, AND COMMUNICATION DEVICE

(71) Applicant: Murata Manufacturing Co., Ltd., Nagaokakyo (JP)

(72) Inventors: Takuya Koyanagi, Nagaokakyo (JP); Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/945,139

(22) Filed: Sep. 15, 2022

(65) Prior Publication Data

US 2023/0019446 A1   Jan. 19, 2023

Related U.S. Application Data

(63) Continuation of application No. 16/562,465, filed on Sep. 6, 2019, now Pat. No. 11,476,828, which is a (Continued)

(30) Foreign Application Priority Data

Mar. 9, 2017   (JP) .............................. JP2017-044686

(51) Int. Cl.
*H03H 9/02* (2006.01)
*H03H 9/145* (2006.01)
*H03H 9/25* (2006.01)

(52) U.S. Cl.
CPC .... *H03H 9/02543* (2013.01); *H03H 9/02834* (2013.01); *H03H 9/145* (2013.01); *H03H 9/25* (2013.01)

(58) Field of Classification Search
CPC ........... H03H 9/02543; H03H 9/02834; H03H 9/145; H03H 9/25
See application file for complete search history.

(56) References Cited

U.S. PATENT DOCUMENTS 11,476,828 B2 * 10/2022 Koyanagi .......... H03H 9/02834
2005/0077982 A1 * 4/2005 Funasaka ........... H03H 9/02574
333/195

(Continued)

OTHER PUBLICATIONS

Koyanagi et al., "Acoustic Wave Device, Acoustic Wave Device Package, Radio-Frequency Front-End Circuit, and Communication Device", U.S. Appl. No. 16/562,465, filed Sep. 6, 2019.

*Primary Examiner* — Eugene Yun
(74) *Attorney, Agent, or Firm* — Keating & Bennett, LLP

(57) ABSTRACT

An acoustic wave device includes a silicon oxide film, a piezoelectric body, and an interdigital transducer electrode laminated on a support substrate made of silicon. Where a wave length that is determined by an electrode finger pitch of the interdigital transducer electrode is λ, a thickness of the support substrate is greater than or equal to about 3λ. An acoustic velocity of the first higher mode that propagates through the piezoelectric body is an acoustic velocity $V_{Si} = (V_1)^{1/2}$ of bulk waves that propagate in the support substrate, which is determined by $V_1$ out of solutions $V_1$, $V_2$, and $V_3$ of x derived from the mathematical expression $Ax^3 + Bx^2 + Cx + D = 0$, or higher than $V_{Si}$.

19 Claims, 12 Drawing Sheets

Related U.S. Application Data continuation of application No. PCT/JP2018/008912, filed on Mar. 8, 2018.

(56) References Cited

U.S. PATENT DOCUMENTS

| | | | |
|---|---|---|---|
| 2010/0182101 A1* | 7/2010 | Suzuki | H03H 9/173 333/193 |
| 2019/0123710 A1* | 4/2019 | Plesski | H03H 9/6406 |
| 2019/0160463 A1* | 5/2019 | Ai | B01L 3/00 |

* cited by examiner

US 11,671,071 B2

ACOUSTIC WAVE DEVICE, ACOUSTIC WAVE DEVICE PACKAGE, RADIO-FREQUENCY FRONT-END CIRCUIT, AND COMMUNICATION DEVICE

CROSS REFERENCE TO RELATED APPLICATIONS

This application claims the benefit of priority to Japanese Patent Application No. 2017-044686 filed on Mar. 9, 2017 and is a Continuation Application of PCT Application No. PCT/JP2018/008912 filed on Mar. 8, 2018. The entire contents of each application are hereby incorporated herein by reference.

BACKGROUND OF THE INVENTION

1. Field of the Invention

The present invention relates to an acoustic wave device in which a piezoelectric body is provided on a support substrate made of silicon.

2. Description of the Related Art

Various acoustic wave devices that include a support substrate made of silicon have been suggested.

Japanese Unexamined Patent Application Publication No. 2010-187373 describes an acoustic wave device in which an organic adhesion layer and a piezoelectric substrate are laminated on a support substrate made of silicon. Heat resistance is increased by bonding on a silicon (111) surface.

In the acoustic wave device described in Japanese Unexamined Patent Application Publication No. 2010-187373, depending on the crystal orientation of the support substrate made of silicon, the acoustic velocity of bulk waves that propagate through the support substrate can be higher than the acoustic velocity of a higher mode that propagates through the piezoelectric body. In this case, there is a problem in that a higher mode to be leaked to a support substrate side is enclosed in an upper layer with respect to the support substrate and, as a result, the response of the higher mode increases.

When the higher mode is a first higher mode of which the frequency is higher than that of a main mode that propagates through the piezoelectric body and is closest to the frequency of the response of the main mode, the first higher mode lies near the response of the main mode. Therefore, this may adversely influence filter characteristics.

Here, the main mode is the mode of waves, in which, when the acoustic wave device is a resonator for a band pass filter, at least one of a resonant frequency and an anti-resonant frequency lies in a pass band of the filter and the difference between the impedance at the resonant frequency and the impedance at the anti-resonant frequency is the greatest. In addition, when the acoustic wave device is a filter, the main mode is the mode of waves, which is used to provide the pass band of the filter.

SUMMARY OF THE INVENTION

Preferred embodiments of the present invention provide acoustic wave devices, acoustic wave device packages, radio-frequency front-end circuits, and communication devices that are each able to reduce or prevent the response of the first higher mode that propagates through a piezoelectric body.

An acoustic wave device according to a preferred embodiment of the present invention includes a support substrate made of silicon, a silicon oxide film provided on or above the support substrate, a piezoelectric body provided on or above the silicon oxide film, and an interdigital transducer electrode provided on or above one of main surfaces of the piezoelectric body. Where a wave length that is determined by an electrode finger pitch of the interdigital transducer electrode is $\lambda$, a thickness of the support substrate is greater than or equal to about $3\lambda$. An acoustic velocity of a first higher mode that propagates through the piezoelectric body is equal to an acoustic velocity $V_{Si}$ of the following mathematical expression (1), which is an acoustic velocity of bulk waves that propagate in the support substrate, or higher than the acoustic velocity $V_{Si}$.

In preferred embodiments of the present invention, the acoustic velocity $V_{Si}$ is expressed by the following mathematical expression (1).

$$V_{Si}=(V_1)^{1/2} \text{ (m/s)} \qquad \text{mathematical expression (1)}$$

$V_1$ in the mathematical expression (1) is a solution to the following mathematical expression (2).

$$Ax^3+Bx^2+Cx+D=0 \qquad \text{mathematical expression (2)}$$

In the mathematical expression (2), A, B, C, and D are respectively values expressed by the following mathematical expressions (2A) to (2D).

$$A=-\rho^3 \qquad \text{mathematical expression (2A)}$$

$$B=\rho^2(L_{11}+L_{22}+L_{33}) \qquad \text{mathematical expression (2B)}$$

$$C=\rho(L_{21}^2+L_{23}^2+L_{31}^2-L_{11} \cdot L_{33}-L_{22} \cdot L_{33}-L_{11} \cdot L_{22}) \qquad \text{mathematical expression (2C)}$$

$$D=2 \cdot L_{21} \cdot L_{23} \cdot L_{31}+L_{11} \cdot L_{22} \cdot L_{33}-L_{31}^2 L_{22}-L_{11} \cdot L_{23}^2 - L_{21}^2 \cdot L_{33} \qquad \text{mathematical expression (2D)}$$

In the mathematical expression (2A), the mathematical expression (2B), the mathematical expression (2C), or the mathematical expression (2D), $\rho=2.331$ (g/cm$^3$). $L_{11}$, $L_{22}$, $L_{33}$, $L_{11}$, $L_{31}$, and $L_{23}$ are values expressed by the following mathematical expressions (3A) to (3F).

$$L_{11}=c_{11} \cdot a_1^2+c_{44} \cdot a_2^2+c_{44} \cdot a_3^2 \qquad \text{mathematical expression (3A)}$$

$$L_{22}=c_{44} \cdot a_1^2+c_{11} \cdot a_2^2+c_{44} \cdot a_3^2 \qquad \text{mathematical expression (3B)}$$

$$L_{33}=c_{44} \cdot a_1^2+c_{44} \cdot a_2^2+c_{11} \cdot a_3^2 \qquad \text{mathematical expression (3C)}$$

$$L_{21}=(c_{12}+c_{44}) \cdot a_2 \cdot a_1 \qquad \text{mathematical expression (3D)}$$

$$L_{31}=(c_{12}+c_{44}) \cdot a_1 \cdot a_3 \qquad \text{mathematical expression (3E)}$$

$$L_{23}=(c_{44}+c_{12}) \cdot a_3 \cdot a_2 \qquad \text{mathematical expression (3F)}$$

In the mathematical expressions (3A) to (3F), $c_{11}$ is about 1.674E+11 (N/m$^2$), $c_{12}$ is about 6.523E+10 (N/m$^2$), and $c_{11}$ is about 7.957E+10 (N/m$^2$). $a_1$, $a_2$, and $a_3$ are values expressed by the following mathematical expressions (4A) to (4C).

$$a_1=\cos(\phi) \cdot \cos(\psi)-\sin(\phi) \cdot \cos(\theta) \cdot \sin(\psi) \qquad (4A)$$

$$a_2=\sin(\phi) \cdot \cos(\psi)+\cos(\phi) \cdot \cos(\theta) \cdot \sin(\psi) \qquad (4B)$$

$$a_3=\sin(\theta) \cdot \sin(\psi) \qquad (4C)$$

$\phi$, $\theta$, and $\psi$ in the mathematical expressions (4A) to (4C) are $\phi$, $\theta$, and $\psi$ in a crystal orientation ($\phi$, $\theta$, $\psi$) of the support substrate.

In an acoustic wave device according to a preferred embodiment of the present invention, the thickness of the support substrate is greater than or equal to about $20\lambda$. In this case, since the thickness of the support substrate is greater than or equal to about 20λ, the response of a second higher mode having a further higher frequency is also reduced or prevented.

In an acoustic wave device according to a preferred embodiment of the present invention, the film thickness of the silicon oxide film falls within any one of ranges shown in the following Table 1. In this case, a second higher mode can be reduced or prevented.

TABLE 1

| SiO$_2$ Film Thickness Range | Silicon Acoustic Velocity V$_{Si}$ |
| --- | --- |
| 0.00λ < SiO$_2$ ≤ 0.40λ | Lower Than or Equal to 5500 m/s |
| 0.40λ < SiO$_2$ ≤ 0.64λ | Lower Than or Equal to 5300 m/s |
| 0.64λ < SiO$_2$ ≤ 0.84λ | Lower Than or Equal to 5100 m/s |
| 0.84λ < SiO$_2$ ≤ 1.04λ | Lower Than or Equal to 4900 m/s |
| 1.04λ < SiO$_2$ ≤ 1.20λ | Lower Than or Equal to 4700 m/s |

In an acoustic wave device according to a preferred embodiment of the present invention, the film thickness of the silicon oxide film falls within any one of ranges shown in the following Table 2. In this case, the first higher mode can be further reduced or prevented.

TABLE 2

| SiO$_2$ Film Thickness Range | Silicon Acoustic Velocity V$_{Si}$ |
| --- | --- |
| 0.00λ < SiO$_2$ ≤ 0.12λ | Lower Than or Equal to 5300 m/s |
| 0.12λ < SiO$_2$ ≤ 0.34λ | Lower Than or Equal to 5100 m/s |
| 0.34λ < SiO$_2$ ≤ 0.44λ | Lower Than or Equal to 4900 m/s |
| 0.44λ < SiO$_2$ ≤ 0.54λ | Lower Than or Equal to 4700 m/s |

In an acoustic wave device according to a preferred embodiment of the present invention, $V_1$ in the mathematical expression (1) is a minimum value among solutions $V_1$, $V_2$, and $V_3$ to the mathematical expression (2). In this case, the response of a higher mode is further effectively reduced or prevented.

In an acoustic wave device according to a preferred embodiment of the present invention, preferably, the acoustic velocity $V_{Si}$ of the support substrate is lower than or equal to about 4700 m/s. In this case, in the range in which the film thickness of the silicon oxide film falls within the range of less than or equal to about 1.20λ, the response of a higher mode is reduced or prevented.

In an acoustic wave device according to a preferred embodiment of the present invention, the thickness of the support substrate is less than or equal to about 180 μm. In this case, a heat radiation property is improved, and a low profile is achieved.

In an acoustic wave device according to a preferred embodiment of the present invention, the film thickness of the piezoelectric body is less than or equal to about 3.5λ. In this case, the degree of energy concentration of acoustic waves is increased, such that a loss can be reduced.

In an acoustic wave device according to a preferred embodiment of the present invention, the piezoelectric body is made of LiTaO$_3$.

In an acoustic wave device according to a preferred embodiment of the present invention, the acoustic velocity of bulk waves that propagate through the silicon oxide film is lower than an acoustic velocity of acoustic waves that propagate through the piezoelectric body. In this case, a higher mode is further effectively leaked to a silicon oxide film side.

In an acoustic wave device according to a preferred embodiment of the present invention, the acoustic velocity of bulk waves that propagate through the support substrate is higher than an acoustic velocity of acoustic waves that propagate through the piezoelectric body.

In an acoustic wave device according to a preferred embodiment of the present invention, the acoustic wave device further includes a high acoustic velocity material layer between the silicon oxide film and the support substrate, and an acoustic velocity of bulk waves that propagate through the high acoustic velocity material layer is higher than an acoustic velocity of acoustic waves that propagate through the piezoelectric body. In this case, the response of a higher mode is further effectively reduced or prevented.

In an acoustic wave device according to a preferred embodiment of the present invention, the acoustic wave device further includes a dielectric layer provided between the piezoelectric body and the interdigital transducer electrode.

In an acoustic wave device according to a preferred embodiment of the present invention, the dielectric layer is made of silicon oxide or tantalum pentoxide. Particularly, in the case of silicon oxide, the dielectric layer has positive temperature characteristics (the frequency increases as the temperature increases), so the frequency-temperature characteristics are improved.

In an acoustic wave device according to a preferred embodiment of the present invention, the acoustic wave device further includes a support layer surrounding the interdigital transducer electrode, a cover member covering the support layer and providing a hollow space surrounding the interdigital transducer electrode, and a plurality of metal bumps provided on the cover member and electrically connected to the interdigital transducer electrode. In this case, the acoustic wave device according to the present preferred embodiment with a WLP structure is provided.

In an acoustic wave device according to a preferred embodiment of the present invention, the acoustic wave device further includes a support layer surrounding the interdigital transducer electrode, and a cover member covering the support layer and providing a hollow space surrounding the interdigital transducer electrode. In the support substrate, at least one through via extending through the support substrate and at least one terminal electrode electrically connected to the at least one through via and provided on a surface on an opposite side of the support substrate from a side on which the interdigital transducer electrode is provided, are provided. The at least one through via is electrically connected to the interdigital transducer electrode and the at least one terminal electrodes. In this case, since the at least one terminal electrode is provided on the surface of the support substrate on the opposite side from the side on which the interdigital transducer electrode is provided, miniaturization is achieved as compared to the case where the at least one terminal electrode is provided on a cover member side.

An acoustic wave device package according to a preferred embodiment of the present invention includes a case substrate on one surface of which a plurality of electrode lands are provided, and an acoustic wave device according to a preferred embodiment of the present invention. At least one metal bump electrically connected to the interdigital transducer electrode is provided on the acoustic wave device. The acoustic wave device is mounted on the case substrate such that the at least one metal bump of the acoustic wave device is joined with at least one of the electrode lands. The acoustic wave device package further includes a sealing resin layer provided on the case substrate so as to seal the acoustic wave device.

In an acoustic wave package according to a preferred embodiment of the present invention, the acoustic wave device package includes a case substrate on one surface of which a plurality of electrode lands are provided, and an acoustic wave device according to a preferred embodiment of the present invention and having a WLP structure. The acoustic wave device is mounted on the case substrate such that the plurality of metal bumps are joined with the plurality of electrode lands of the case substrate. The acoustic wave device package further includes a sealing resin layer provided so as to seal the acoustic wave device. In this case, a gap may be provided between the cover member and the case substrate.

With the acoustic wave device and acoustic wave device packages according to preferred embodiments of the present invention, the response of a first higher mode higher in frequency than a main mode that propagates through the piezoelectric body and whose frequency is closest to the response of the main mode is reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified by describing specific preferred embodiments of the present invention with reference to the drawings.

The preferred embodiments that will be described in this specification are illustrative and partial replacement or combination of components is possible among the different preferred embodiments.

Figure 1A:
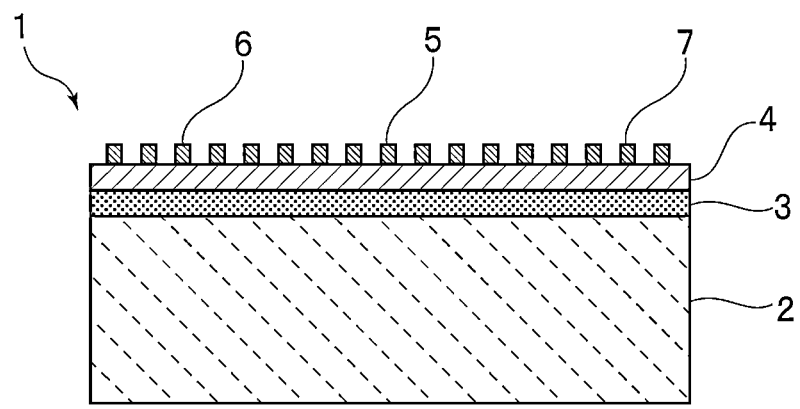
FIG. 1A is a front cross-sectional view of an acoustic wave device according to a first preferred embodiment of the present invention.

FIG. 1A is a front cross-sectional view of an acoustic wave device according to a first preferred embodiment of the present invention. The acoustic wave device 1 includes a support substrate 2 preferably made of silicon, for example. The support substrate 2 preferably has a monocrystal structure with a crystal orientation. The support substrate 2 need not have a monocrystal structure as long as the support substrate 2 has a crystal orientation. In the present preferred embodiment, the support substrate 2 made of silicon is used as the support substrate 2. Alternatively, the support substrate 2 may partially contain impurities. This applies not only to the first preferred embodiment but also to all of the following preferred embodiments.

A silicon oxide film 3 is laminated on the support substrate 2. The silicon oxide film 3 is preferably made of SiO$_2$ or another material, for example. The silicon oxide film 3 may be laminated indirectly on the support substrate 2.

Figure 1B:
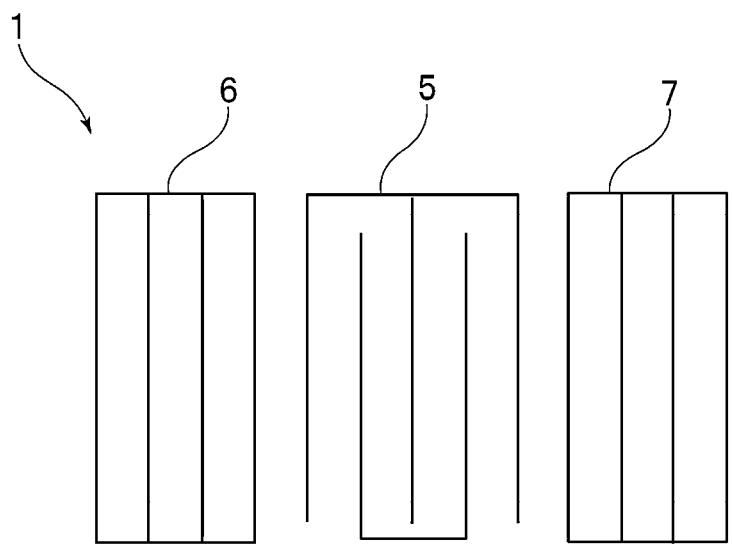
FIG. 1B is a schematic plan view that shows the electrode structure of the acoustic wave device in the first preferred embodiment of the present invention.

A piezoelectric body 4 is laminated directly or indirectly on the silicon oxide film 3. Here, the piezoelectric body 4 is preferably made of, for example, LiTaO$_3$. The piezoelectric body 4 is provided indirectly on the support substrate 2. An interdigital transducer electrode 5 and reflectors 6, 7 are provided on the piezoelectric body 4. As shown in FIG. 1B, the electrode structure of the acoustic wave device 1 includes the interdigital transducer electrode 5 and the reflectors 6, 7. The acoustic wave device 1 is preferably a one-port acoustic wave resonator, for example.

The interdigital transducer electrode 5 is provided on the top surface of the piezoelectric body 4. Alternatively, the interdigital transducer electrode 5 may be provided on the bottom surface of the piezoelectric body 4. A dielectric film may be provided on the interdigital transducer electrode 5.

The inventors of preferred embodiments of the present invention newly discovered that, where the wave length that was determined by the electrode finger pitch of the interdigital transducer electrode 5 was $\lambda$, a first higher mode was reduced or prevented when the thickness of the support substrate 2 was greater than or equal to about $3\lambda$. Preferred embodiments of the present invention are based on this new discovery. This will be described below.

Figure 2:
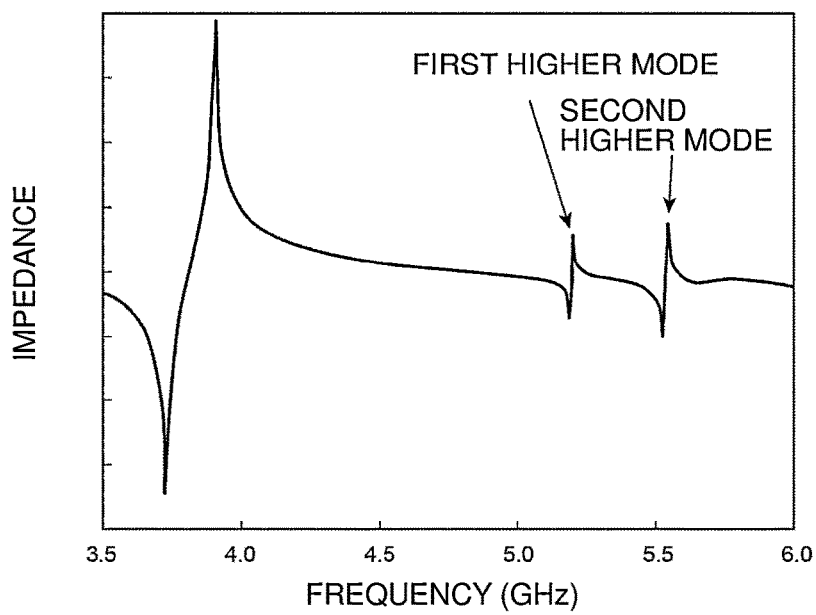
FIG. 2 is a graph for illustrating first and second higher modes.

In the acoustic wave device 1, a plurality of higher modes usually appears. FIG. 2 shows the resonant characteristics of the acoustic wave device in which, for example, the silicon oxide film 3 having a thickness of about $0.3\lambda$, the piezoelectric body 4 having a thickness of about $0.2\lambda$, the interdigital transducer electrode 5 made of Al and having a thickness of about $0.08\lambda$, and the reflectors 6, 7 are provided on the support substrate 2 made of silicon with a crystal orientation of (0°, 0°, 0°). The wave length $\lambda$ that is determined by the electrode finger pitch of the interdigital transducer electrode 5 is preferably about 1 μm, for example.

When the acoustic wave device 1 is excited, the response of a plurality of higher modes appears in a frequency range higher than the response of a main mode. Of these, the higher mode closest to the response of the main mode us denoted as a first higher mode, and the higher mode close to the response of the main mode after the first higher mode is denoted as a second higher mode.

A main mode means a mode of which, when an acoustic wave device is a resonator for a band pass filter, at least one of a resonant frequency and an anti-resonant frequency falls within a pass band and the ratio of an impedance at the anti-resonant frequency to an impedance at the resonant frequency is the greatest.

As shown in FIG. 2, the response of the first higher mode is present around 5.25 GHz. Between about 5.5 GHz and about 5.6 GHz, the response of the second higher mode is present.

In the acoustic wave device 1, to obtain good characteristics, at least the first higher mode closest to the main mode needs to be reduced or prevented.

Figure 3:
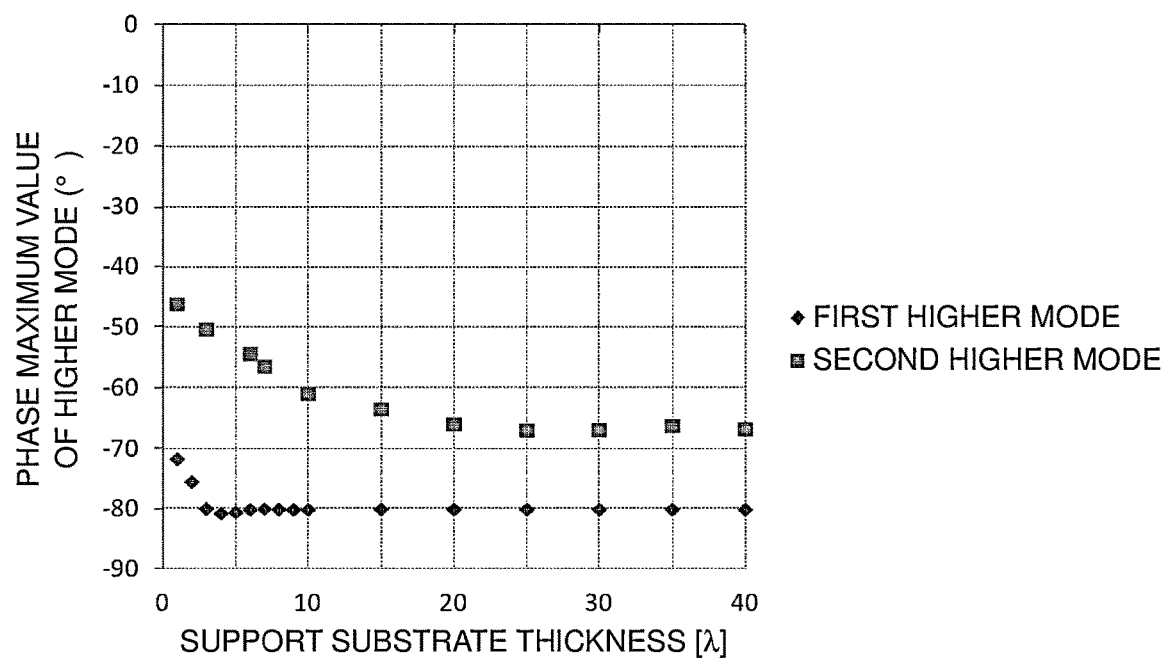
FIG. 3 is a graph that shows the relationship between the thickness of a support substrate made of silicon and a phase maximum value of each of first and second higher modes.

FIG. 3 is a graph that shows the relationship between the thickness of the support substrate made of silicon and a phase maximum value of each of the first and second higher modes.

As is apparent from FIG. 3, as for the first higher mode, as the thickness of the support substrate 2 increases, the phase maximum value of the first higher mode increases. As the thickness of the support substrate 2 becomes greater than or equal to about $3\lambda$, the phase maximum value of the first higher mode is almost constant. Therefore, to reduce or prevent the first higher mode, the thickness of the support substrate 2 is preferably greater than or equal to about $3\lambda$, for example.

As is apparent from FIG. 3, when the thickness of the support substrate 2 is greater than or equal to about $20\lambda$, the phase maximum value of each of the first higher mode and the second higher mode is reduced. In addition, when the thickness of the support substrate 2 is greater than or equal to about $20\lambda$, the phase maximum value of each of the first higher mode and the second higher mode is almost constant. Therefore, to reduce or prevent the first higher mode and the second higher mode, the thickness of the support substrate 2 is preferably greater than or equal to about $20\lambda$, for example.

When the thickness of the support substrate 2 is excessive, the heat radiation property decreases and a low profile becomes difficult. Therefore, it is preferable that the upper limit of the thickness of the support substrate 2 is less than or equal to about 180 μm, for example.

Therefore, it is preferable that the thickness of the support substrate 2 is greater than or equal to about $20\lambda$ and less than or equal to about 180 μm, for example. In this case, $\lambda$ is preferably less than about 9 μm, for example.

The inventors of preferred embodiments of the present invention newly discovered that, when the acoustic velocity $V_{Si}$ of bulk waves propagating in a support substrate was higher than the acoustic velocity of a higher mode propagating through a piezoelectric body, the response of the higher mode propagating through the piezoelectric body increased and, when the acoustic velocity $V_{Si}$ was equal or substantially equal to the acoustic velocity of the higher mode propagating through the piezoelectric body or lower than the acoustic velocity of the higher mode propagating through the piezoelectric body, the response of the higher mode propagating through the piezoelectric body was reduced. Preferred embodiments of the present invention are based on this new discovery. Hereinafter, the acoustic velocity $V_{Si}$ may be referred to as the acoustic velocity of the support substrate.

The acoustic velocity $V_{Si}$ of bulk waves that propagate in the support substrate is expressed by the following mathematical expressions (1) to (4C) and varies depending on the values of the crystal orientation ($\phi$, $\theta$, $\psi$) of the support substrate made of silicon.

$$V_{Si} = (V_1)^{1/2} \text{ (m/s)} \qquad \text{mathematical expression (1)}$$

In the mathematical expression (1), $V_1$ is a solution to the following mathematical expression (2).

$$Ax^3 + Bx^2 + Cx + D = 0 \qquad \text{mathematical expression (2)}$$

In the mathematical expression (2), A, B, C, and D are respectively values expressed by the following mathematical expressions (2A) to (2D).

$$A = -\rho^3 \qquad \text{mathematical expression (2A)}$$

$$B = \rho^2(L_{11} + L_{22} + L_{33}) \qquad \text{mathematical expression (2B)}$$

$$C = \rho(L_{21}^2 + L_{23}^2 + L_{31}^2 - L_{11} \cdot L_{33} - L_{22} \cdot L_{33} - L_{11} \cdot L_{22}) \qquad \text{mathematical expression (2C)}$$

$$D = 2 \cdot L_{21} \cdot L_{23} \cdot L_{31} + L_{11} \cdot L_{22} \cdot L_{33} - L_{31}^2 \cdot L_{22} - L_{11} \cdot L_{23}^2 - L_{21}^2 L_{33} \qquad \text{mathematical expression (2D)}$$

In the mathematical expression (2A), the mathematical expression (2B), the mathematical expression (2C), or the mathematical expression (2D), $\rho$ is the density (g/cm$^3$) of silicon and $\rho$ is 2.331 (g/cm$^3$). $L_{11}$, $L_{22}$, $L_{33}$, $L_{21}$, $L_{31}$, and $L_{23}$ are values expressed by the following mathematical expressions (3A) to (3F).

$$L_{11} = c_{11} \cdot a_1^2 + c_{44} \cdot a_2^2 + c_{44} \cdot a_3^2 \qquad \text{mathematical expression (3A)}$$

$$L_{22} = c_{44} \cdot a_1^2 + c_{11} \cdot a_2^2 + c_{44} \cdot a_3^2 \qquad \text{mathematical expression (3B)}$$

$$L_{33} = c_{44} \cdot a_1^2 + c_{44} \cdot a_2^2 + c_{11} \cdot a_3^2 \qquad \text{mathematical expression (3C)}$$

$$L_{21} = (c_{12} + c_{44}) \cdot a_2 \cdot a_1 \qquad \text{mathematical expression (3D)}$$

$$L_{31}=(c_{12}+c_{44})\cdot a_1\cdot a_3 \quad \text{mathematical expression (3E)}$$

$$L_{23}=(c_{44}+c_{12})\cdot a_3\cdot a_2 \quad \text{mathematical expression (3F)}$$

In the mathematical expressions (3A) to (3F), $c_{11}$, $c_{12}$, and $c_{44}$ are elastic constants (N/m$^2$) of silicon, and $c_{11}$ is about 1.674E+11 (N/m$^2$), $c_{12}$ is about 6.523E+10 (N/m$^2$), and $c_{44}$ is about 7.957E+10 (N/m$^2$), for example. $a_1$, $a_2$, and $a_3$ are values expressed by the following mathematical expressions (4A) to (4C).

$$a_1=\cos(\phi)\cdot\cos(\psi)-\sin(\phi)\cdot\cos(\theta)\cdot\sin(\psi) \quad \text{mathematical expression (4A)}$$

$$a_2=\sin(\phi)\cdot\cos(\psi)+\cos(\phi)\cdot\cos(\theta)\cdot\sin(\psi) \quad \text{mathematical expression (4B)}$$

$$a_3=\sin(\theta)\cdot\sin(\psi) \quad \text{mathematical expression (4C)}$$

$\phi$, $\theta$, and $\psi$ in the mathematical expressions (4A) to (4C) are $\phi$, $\theta$, and $\psi$ in a crystal orientation ($\phi$, $\theta$, $\psi$) of the support substrate made of silicon.

Figure 4:
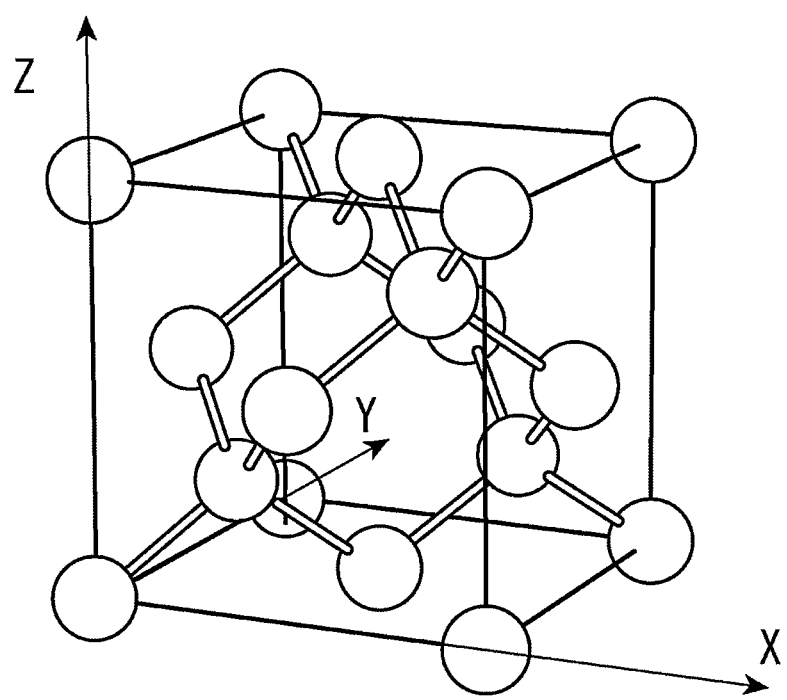
FIG. 4 is a schematic diagram for illustrating the definition of the crystal orientation of the support substrate made of silicon.

The crystal orientation ($\phi$, $\theta$, $\psi$) of the support substrate made of silicon will be described with reference to FIG. 4. FIG. 4 is a schematic view for illustrating the definition of the crystal orientation of the support substrate. In the crystal structure of the support substrate of FIG. 4, when the rotation direction of a right-hand thread is positive, Z-X-Z is used as a rotation axis. The crystal orientation ($\phi$, $\theta$, $\psi$) is an orientation as follows. 1) (X, Y, Z) is rotated by $\phi$ around the Z-axis into ($X_1$, $Y_1$, $Z_1$), subsequently, 2) ($X_1$, $Y_1$, $Z_1$) is rotated by $\theta$ around the $X_1$-axis into ($X_2$, $Y_2$, $Z_2$), and then 3) ($X_2$, $Y_2$, $Z_2$) is rotated by $\psi$ around the $Z_2$-axis into ($X_3$, $Y_3$, $Z_3$).

Figure 5:
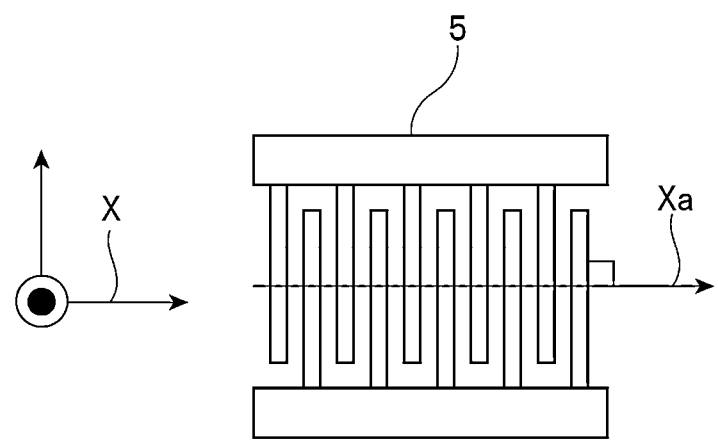
FIG. 5 is a schematic plan view that shows the relationship between the X-axis of the support substrate made of silicon when the crystal orientation ($\phi$, $\theta$, $\psi$) of the support substrate made of silicon is (0°, 0°, 0°) and a direction in which electrode fingers of an interdigital transducer electrode extend.

As shown in FIG. 5, in the acoustic wave device 1, when ($\phi$, $\theta$, $\psi$)=(0°, 0°, 0°), the direction of the X-axis of Si crystal and a direction Xa perpendicular or substantially perpendicular to a direction in which the electrode fingers of the interdigital transducer electrode 5 extend are the same direction.

Here, $V_{Si}$ is calculated as the acoustic velocity of the slowest transversal waves within bulk waves that propagate in the support substrate in the Xa direction.

When the acoustic velocity $V_{Si}$ is calculated by using the mathematical expression (1) where the crystal orientation of silicon in use is, for example, ($\phi$, $\theta$, $\psi$)=(0°, 0°, 0°), the acoustic velocity $V_{Si}$ is about 5843 (m/s).

The elastic constants $c_{11}$, $c_{12}$, and $c_{44}$ of Si are values defined as follows.

A strain S and stress T of an elastic body are in a proportionality relationship. This proportionality relationship is expressed by the following matrix.

$$\begin{bmatrix} T_1 \\ T_2 \\ T_3 \\ T_4 \\ T_5 \\ T_6 \end{bmatrix} = \begin{bmatrix} c_{11} & c_{12} & c_{13} & c_{14} & c_{15} & c_{16} \\ c_{21} & c_{22} & c_{23} & c_{24} & c_{25} & c_{26} \\ c_{31} & c_{32} & c_{33} & c_{34} & c_{35} & c_{36} \\ c_{41} & c_{42} & c_{43} & c_{44} & c_{45} & c_{46} \\ c_{51} & c_{52} & c_{53} & c_{54} & c_{55} & c_{56} \\ c_{61} & c_{62} & c_{63} & c_{64} & c_{65} & c_{66} \end{bmatrix} \begin{bmatrix} S_1 \\ S_2 \\ S_3 \\ S_4 \\ S_5 \\ S_6 \end{bmatrix} \quad \text{Mathematical expression 1}$$

Proportionality constants ($c_{ij}$) of this mathematical expression are referred to as elastic constants. The elastic constants $c_{ij}$ are determined depending on a crystal system to which a solid belongs. For example, for silicon, the elastic constants may be expressed as follows from the symmetry of crystal. The elastic constants (N/m$^2$) of Si $$\begin{bmatrix} c_{11} & c_{12} & c_{12} & 0 & 0 & 0 \\ c_{12} & c_{11} & c_{12} & 0 & 0 & 0 \\ c_{12} & c_{12} & c_{11} & 0 & 0 & 0 \\ 0 & 0 & 0 & c_{44} & 0 & 0 \\ 0 & 0 & 0 & 0 & c_{44} & 0 \\ 0 & 0 & 0 & 0 & 0 & c_{44} \end{bmatrix} \quad \text{Mathematical expression 2}$$

The above-described elastic constants $c_{11}$, $c_{12}$, $c_{44}$ are the elastic constants of Si defined as follows. The elastic constants of Si are $c_{11}$=1.674E+11 (N/m$^2$), $c_{12}$=6.523E+10 (N/m$^2$), and $c_{44}$=7.957E+10 (N/m$^2$) (H. J. McSkimin, et al., "Measurement of the Elastic Constants of Silicon Single Crystals and Their Thermal Constants", Phys. Rev. Vol. 83, p.1080(L) (1951)). The density $\rho$ of silicon is 2.331 (g/cm$^3$).

As described above, the acoustic velocity $V_{Si}$ is calculated using the mathematical expression (1) according to the crystal orientation of the support substrate made of silicon.

It demonstrates that, when the acoustic velocity of the first higher mode that propagates through the piezoelectric body 4 is equal or substantially equal to the acoustic velocity $V_{Si}$ that is shown as follows and that is the acoustic velocity of bulk waves that propagate in the support substrate 2 or higher than the acoustic velocity $V_{Si}$, the first higher mode is reduced or prevented.

Figure 6A:
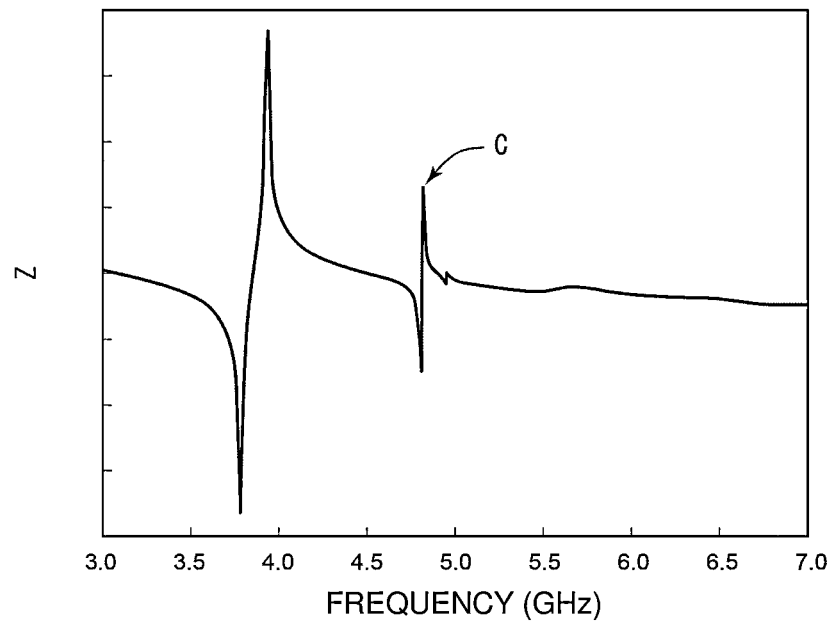
FIGS. 6A and 6B are graphs that respectively show the impedance characteristics of the acoustic wave device whose acoustic velocity $V_{Si}$ is about 5000 m/s and the impedance characteristics of the acoustic wave device whose acoustic velocity $V_{Si}$ is about 4500 m/s.

First, the relationship between the acoustic velocity of the first higher mode and the acoustic velocity $V_{Si}$ of bulk waves that propagate in the support substrate 2 will be described. FIG. 6A is a graph that shows the impedance characteristics of the acoustic wave device whose acoustic velocity $V_{Si}$ is about 5000 m/s when the film thickness of the silicon oxide film is about 0.5λ and the film thickness of the piezoelectric body is about 0.3λ. On the other hand, FIG. 6B is a graph that shows the impedance characteristics of the acoustic wave device configured as in the case of the above except for that the acoustic velocity $V_{Si}$ is about 4500 m/s.

Figure 6B:
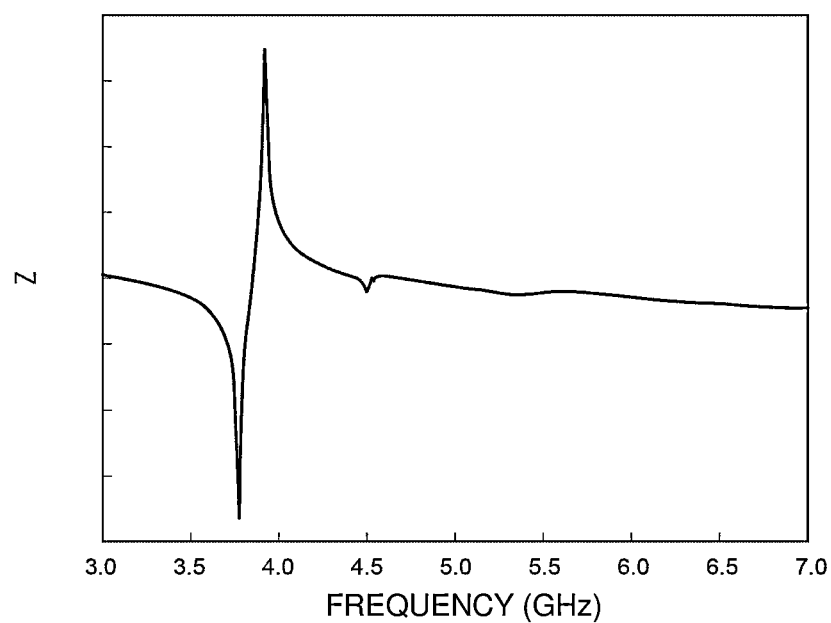

As is apparent from the comparison between FIGS. 6A and 6B, when the acoustic velocity $V_{Si}$ is higher than the acoustic velocity of the first higher mode, the first higher mode remarkably appears as shown by the arrow C. This is because the first higher mode is also enclosed in the silicon oxide film 3 and the piezoelectric body 4. In contrast to this, in FIG. 6B, no remarkable response of the first higher mode appears within the range of about 4.5 GHz to about 5.0 GHz. This is due to the fact that the acoustic velocity $V_{Si}$ is lower than the acoustic velocity of the first higher mode and, therefore, the first higher mode is effectively reduced or prevented. On the other hand, the acoustic velocity $V_{Si}$ can be controlled with the crystal orientation. Therefore, it is discovered that, when the acoustic velocity $V_{Si}$ is lower than the acoustic velocity of the first higher mode, the first higher mode can be effectively reduced or prevented.

In other words, in the acoustic wave device 1, the acoustic velocity of the first higher mode is equal or substantially equal to the acoustic velocity $V_{Si}$ or higher than the acoustic velocity $V_{Si}$. Therefore, the first higher mode leaks to the support substrate 2 side. Thus, the response of the first higher mode is effectively reduced or prevented.

As described above, in the acoustic wave device 1, when the thickness of the support substrate 2 is greater than or equal to about 3λ and the acoustic velocity of the first higher mode that propagates through the piezoelectric body 4 is equal or substantially equal to the acoustic velocity $V_{Si}$ of bulk waves that propagate in the support substrate 2 or higher than the acoustic velocity $V_{Si}$, the response of the first higher mode is further effectively reduced or prevented.

When the thickness of the support substrate 2 is greater than or equal to about 20λ and the acoustic velocity of the first higher mode that propagates through the piezoelectric body 4 is equal or substantially equal to the acoustic velocity $V_{Si}$ of bulk waves that propagate in the support substrate 2 or higher than the acoustic velocity $V_{Si}$, the response of the first higher mode and the response of the second higher mode are further effectively reduced or prevented. Since the acoustic velocity of the second higher mode is higher than the acoustic velocity of the first higher mode, when the acoustic velocity of the first higher mode satisfies the mathematical expression (1), the acoustic velocity of the second higher mode automatically satisfies the mathematical expression (1).

Further characteristics of the acoustic wave device 1 are such that the acoustic velocity of the higher mode that propagates through the piezoelectric body 4 is equal to or higher than the acoustic velocity $V_{Si}$ of the slower transversal waves that propagate in the support substrate 2 and that is expressed by $V_{Si}=(V_1)^{1/2}$, when, of the solutions $V_1$, $V_2$, $V_3$ ($V_1 \le V_2 < V_3$) of x that satisfies the mathematical expression (2), the smallest solution is $V_1$.

With the configuration of the present preferred embodiment, the response of the higher mode is further effectively reduced or prevented.

In addition, in the acoustic wave device 1, it is preferable that, when the wave length of acoustic waves, which is determined by the electrode finger pitch of the interdigital transducer electrode 5, is λ, the film thickness of the piezoelectric body 4 made of LiTaO₃ fall within the range of less than or equal to about 3.5λ, for example. In this case, the quality factor is increased.

More preferably, the film thickness of the piezoelectric body 4 made of LiTaO₃ is less than or equal to about 2.5λ, for example. In this case, the absolute value of the temperature coefficient of resonant frequency (TCF) can be reduced. In addition, preferably, the film thickness of the piezoelectric body 4 made of LiTaO₃ is less than or equal to about 1.5λ, for example. In this case, an electromechanical coupling coefficient can be easily adjusted. In addition, more preferably, the film thickness of the piezoelectric body 4 made of LiTaO₃ is less than or equal to about 0.5λ, for example. In this case, the electromechanical coupling coefficient can be easily adjusted within a wide range.

Other characteristics of the acoustic wave device 1 are such that, when the wave length that is determined by the electrode finger pitch of the interdigital transducer electrode 5 is λ, the acoustic velocity $V_{Si}$ varies as in the range shown in the following Table 3 according to the film thickness of the silicon oxide film 3. In Table 3 and Table 4 (described later), the acoustic velocity $V_{Si}$ of bulk waves that propagate in the support substrate is set to the acoustic velocity $V_{Si}$ of silicon.

TABLE 3

| SiO₂ Film Thickness Range | Silicon Acoustic Velocity $V_{Si}$ |
| --- | --- |
| 0.00λ < SiO₂ ≤ 0.40λ | Lower Than or Equal to 5500 m/s |
| 0.40λ < SiO₂ ≤ 0.64λ | Lower Than or Equal to 5300 m/s |
| 0.64λ < SiO₂ ≤ 0.84λ | Lower Than or Equal to 5100 m/s |
| 0.84λ < SiO₂ ≤ 1.04λ | Lower Than or Equal to 4900 m/s |
| 1.04λ < SiO₂ ≤ 1.20λ | Lower Than or Equal to 4700 m/s |

Figure 7:
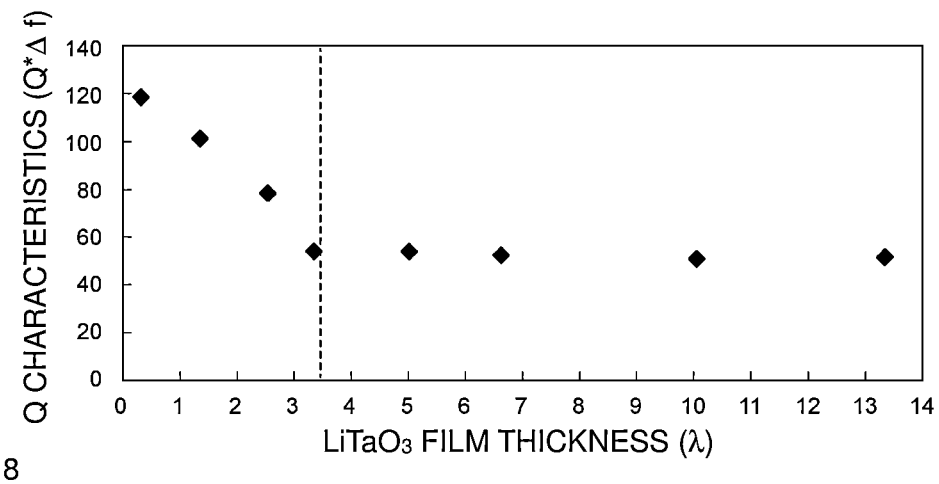
FIG. 7 is a graph that shows the relationship between the film thickness of an LiTaO$_3$ film and quality factor characteristics in the acoustic wave device.
Figure 8:
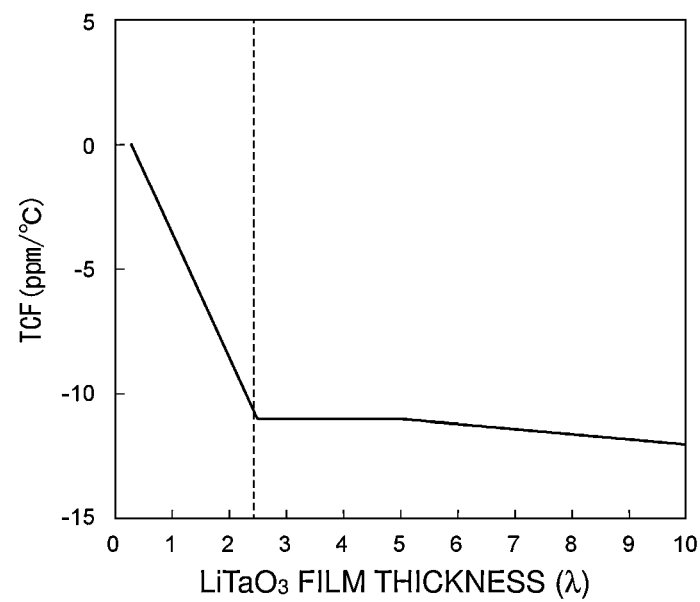
FIG. 8 is a graph that shows the relationship between the film thickness of an LiTaO$_3$ film and the temperature coefficient of resonant frequency (TCF) in the acoustic wave device.
Figure 9:
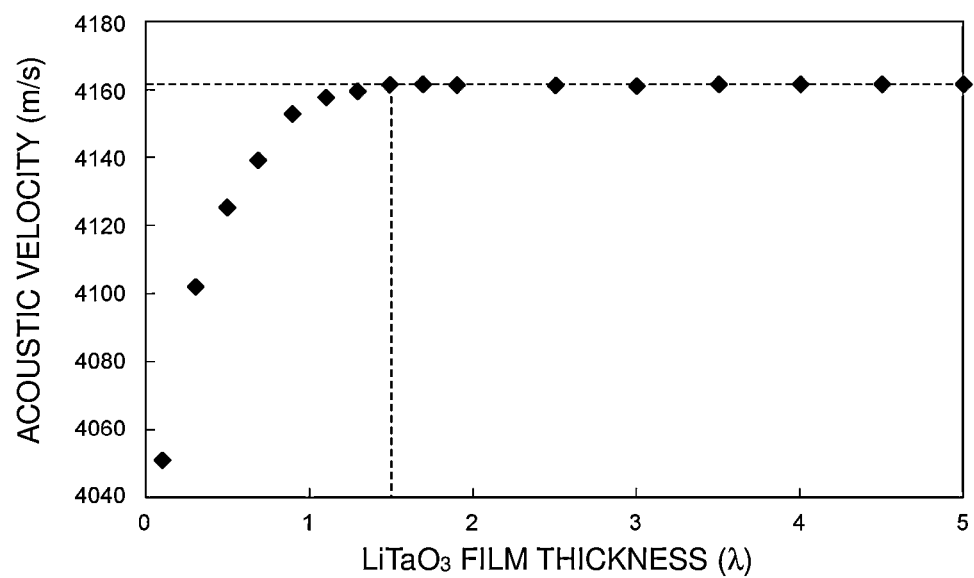
FIG. 9 is a graph that shows the relationship between the film thickness of an LiTaO$_3$ film and an acoustic velocity in the acoustic wave device.

FIG. 7 is a graph that shows the relationship between the film thickness of an LiTaO₃ film and quality factor characteristics in the acoustic wave device in which a low acoustic velocity film made of a silicon oxide film having a thickness of about 0.35, and a piezoelectric film made of lithium tantalate having Euler angles of (0°, 140.0°, 0°) are laminated on a high acoustic velocity support substrate made of silicon. The ordinate axis in FIG. 7 represents the product of the quality factor characteristics and fractional band width (Δf) of a resonator. FIG. 8 is a graph that shows the relationship between the film thickness of the LiTaO₃ film and the temperature coefficient of resonant frequency (TCF). FIG. 9 is a graph that shows the relationship between the film thickness of the LiTaO₃ film and an acoustic velocity. From FIG. 7, it is preferable that the film thickness of the LiTaO₃ film is less than or equal to about 3.5λ, for example. In that case, the quality factor value increases as compared to the case over about 3.5λ. To further increase the quality factor, more preferably, the film thickness of the LiTaO₃ film is less than or equal to about 2.5λ, for example.

From FIG. 8, when the film thickness of the LiTaO₃ film is less than or equal to about 2.5λ, the absolute value of the temperature coefficient of resonant frequency (TCF) is reduced as compared to the case where the film thickness exceeds about 2.5λ. More preferably, the film thickness of the LiTaO₃ film is less than or equal to about 2λ, for example. In this case, the absolute value of the temperature coefficient of resonant frequency (TCF) can be less than or equal to about 10 ppm/° C. To reduce the absolute value of the temperature coefficient of resonant frequency (TCF), it is further preferable that the film thickness of the LiTaO₃ film is less than or equal to about 1.5λ, for example.

From FIG. 9, when the film thickness of the LiTaO₃ film exceeds about 1.5λ, a change in acoustic velocity is extremely small.

Figure 10:
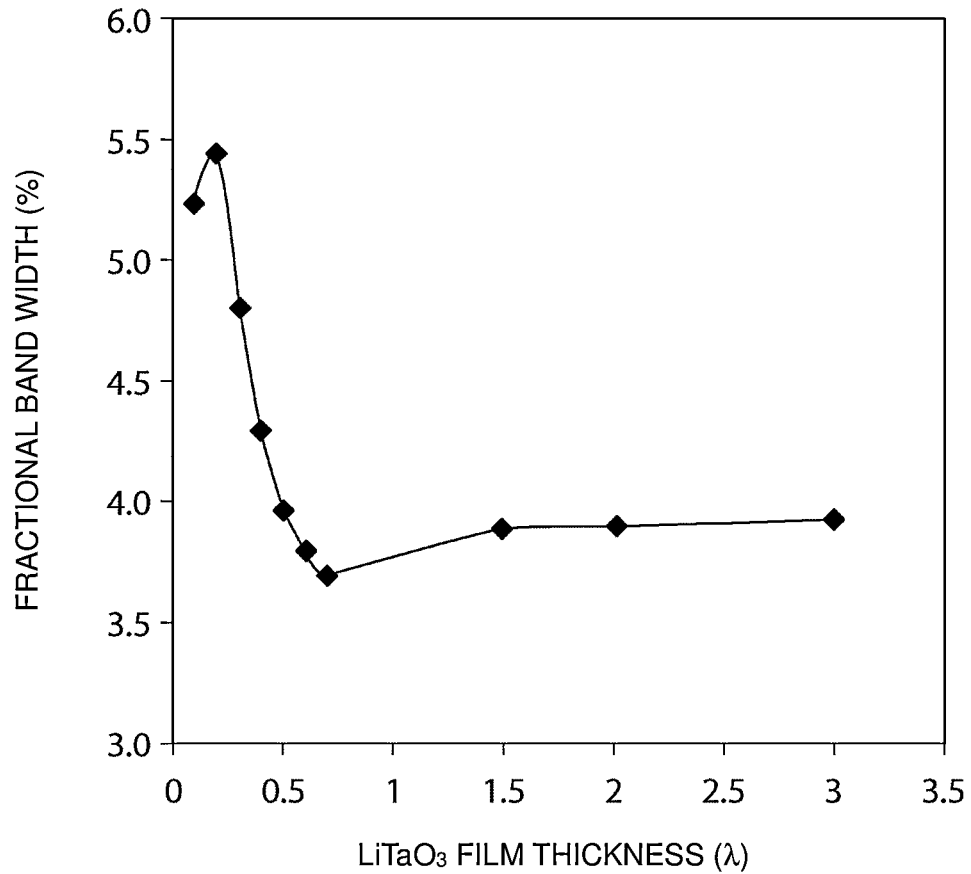
FIG. 10 is a graph that shows the relationship between the film thickness of a piezoelectric film made of LiTaO$_3$ and a fractional band width.

As shown in FIG. 10, when the film thickness of the LiTaO₃ film falls within the range of greater than or equal to about 0.05λ and less than or equal to about 0.5λ, the fractional band width significantly changes. Therefore, the electromechanical coupling coefficient can be adjusted within a wider range. Thus, to expand the adjustable range of each of the electromechanical coupling coefficient and fractional band width, it is preferable that the film thickness of the LiTaO₃ film is greater than or equal to about 0.05λ and less than or equal to about 0.5λ, for example.

Figure 11:
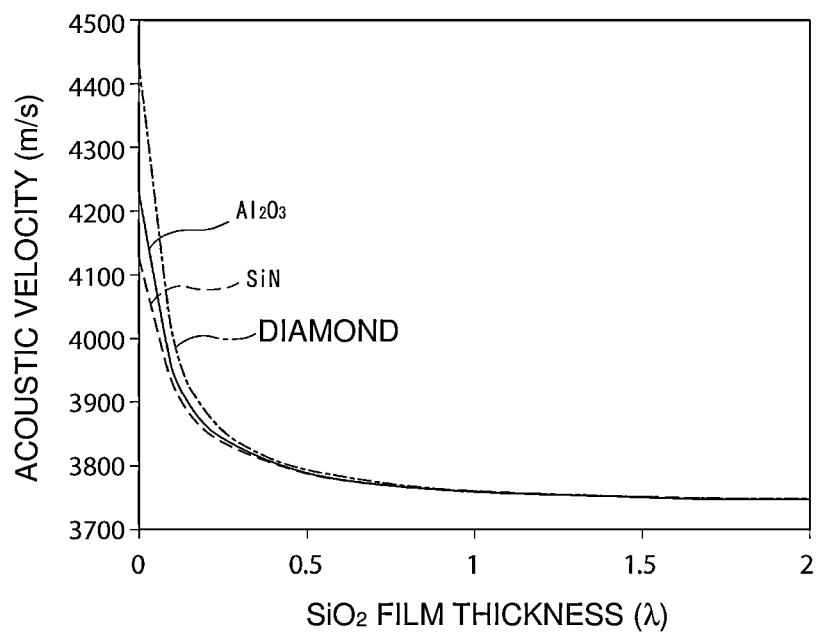
FIG. 11 is a graph that shows the relationship among the film thickness of a silicon oxide film, an acoustic velocity, and the material of a high acoustic velocity film.
Figure 12:
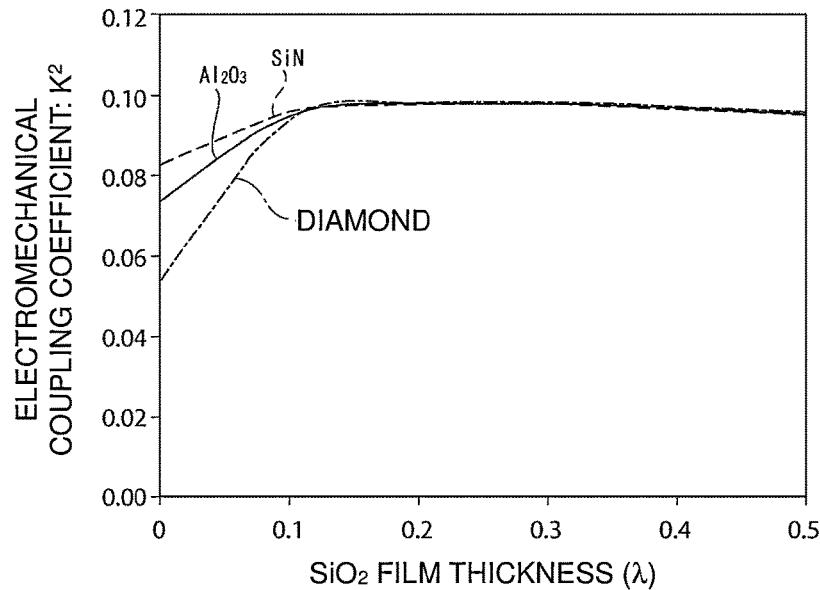
FIG. 12 is a graph that shows the relationship among the film thickness of a silicon oxide film, an electromechanical coupling coefficient, and the material of a high acoustic velocity film.

FIG. 11 is a graph that shows the relationship between the film thickness (λ) of the silicon oxide film and acoustic velocity. FIG. 12 is a graph that shows the relationship between the film thickness (λ) of the silicon oxide film and electromechanical coupling coefficient. Here, the acoustic wave device includes a low acoustic velocity film that defines and functions as a low acoustic velocity material layer and a high acoustic velocity film that defines and functions as a high acoustic velocity material layer. A silicon nitride film, an aluminum oxide film, and diamond each, for example, are preferably used as the high acoustic velocity film on the lower side of the low acoustic velocity film made of SiO₂. The film thickness of the high acoustic velocity film is preferably set to about 1.5λ, for example. The acoustic velocity of bulk waves in silicon nitride is about 6000 m/s. The acoustic velocity of bulk waves in aluminum oxide is about 6000 m/s. The acoustic velocity of bulk waves in diamond is about 12800 m/s. As shown in FIG. 11 and FIG. 12, even when the material of the high acoustic velocity film and the film thickness of the silicon oxide film are changed, the electromechanical coupling coefficient and the acoustic velocity almost do not change. Particularly, when the film thickness of the silicon oxide film is greater than or equal to about 0.1λ and less than or equal to about 0.5λ, the electromechanical coupling coefficient almost does not change regardless of the material of the high acoustic velocity film.

It is discovered from FIG. 11 that, when the film thickness of the silicon oxide film is greater than or equal to about $0.3\lambda$ and less than or equal to about $2\lambda$, the acoustic velocity does not change regardless of the material of the high acoustic velocity film. Therefore, preferably, the film thickness of the low acoustic velocity film made of silicon oxide is less than or equal to about $2\lambda$, and, more preferably, the film thickness is less than or equal to about $0.5\lambda$, for example.

Figure 13:
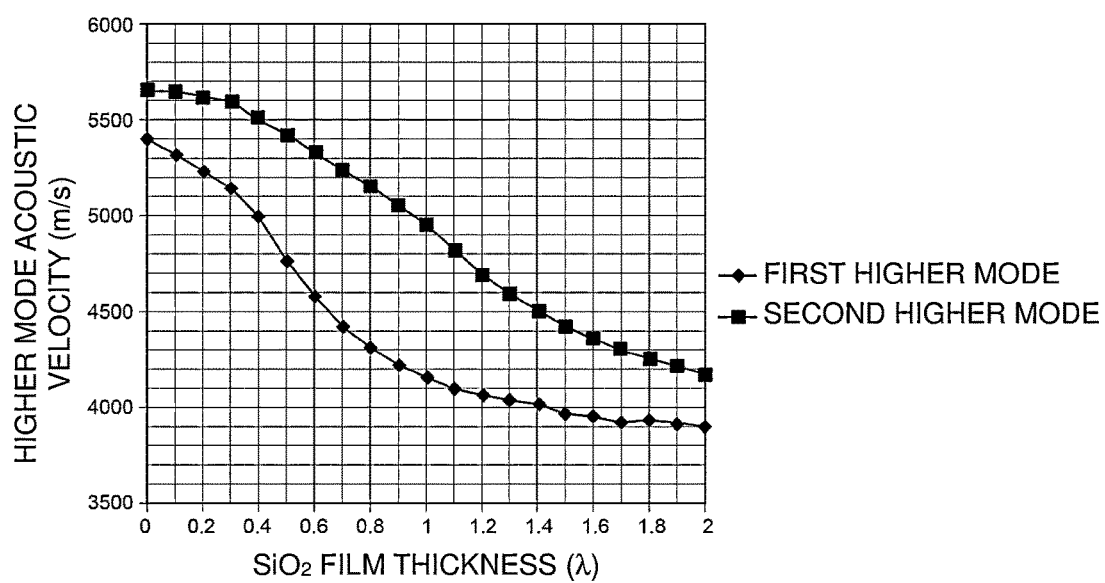
FIG. 13 is a graph that shows the relationship between the film thickness of a silicon oxide film and the acoustic velocity of a higher mode.

The acoustic velocities of the first higher mode and second higher mode can be adjusted by the silicon oxide film 3. FIG. 13 is a graph that shows the relationship between the film thickness of the silicon oxide film 3 and the acoustic velocity of each of the first higher mode and the second higher mode. Calculation conditions for FIG. 13 are that the thickness of the piezoelectric body 4 is about $0.3\lambda$, the cut angle is about 50° Y, the crystal orientation of the support substrate 2 made of silicon is (0°, 0°, 0°), the interdigital transducer electrode 5 is made of Al with a thickness of about $0.08\lambda$, and the wave length is about 1 μm. The piezoelectric body 4 is an $LiTaO_3$ film. FIG. 13 shows the acoustic velocity of the first higher mode and the acoustic velocity of the second higher mode. It appears that the acoustic velocities of these two types of higher modes vary according to a change in the film thickness of the silicon oxide film.

As shown in FIG. 13, when the film thickness of the silicon oxide film 3 is, for example, about $0.40\lambda$, the acoustic velocity of the second higher mode is about 5500 m/s. Therefore, it is discovered that, when the acoustic velocity of the support substrate 2 is lower than or equal to about 5500 m/s, the second higher mode can be reduced or prevented. Thus, from FIG. 13, when the film thickness of the silicon oxide film 3 is less than or equal to about $0.40\lambda$, the acoustic velocity of the support substrate 2 just needs to be lower than or equal to about 5500 m/s. Similarly, it is discovered that, when the film thickness of the silicon oxide film 3 exceeds about $0.40\lambda$ and is less than or equal to about $0.64\lambda$, the acoustic velocity of the support substrate 2 just needs to be lower than or equal to about 5300 m/s. Therefore, to reduce or prevent the second higher mode, any one of the ranges of the acoustic velocity of the support substrate just needs to be employed according to the film thickness of the silicon oxide film 3, shown in the above-described Table 3. Thus, the second higher mode is reduced or prevented.

On the other hand, to reduce or prevent both the first higher mode and the second higher mode, the acoustic velocity of the support substrate 2 just needs to fall within any one of the ranges shown in the following Table 4 according to the range of the film thickness of the silicon oxide film 3.

For example, as shown in FIG. 13, the acoustic velocity of the first higher mode is about 5300 m/s when the film thickness of the silicon oxide film 3 is about $0.12\lambda$. Therefore, when the film thickness of the silicon oxide film 3 is less than or equal to about $0.12\lambda$, the acoustic velocity of the support substrate 2 just needs to be lower than or equal to about 5300 m/s. Similarly, when the film thickness of the silicon oxide film 3 is about $0.34\lambda$, the acoustic velocity of the first higher mode is about 5100 m/s as shown in FIG. 13. Therefore, when the film thickness of the silicon oxide film 3 exceeds about $0.12\lambda$ and is less than or equal to about $0.34\lambda$, both of the first higher mode and the second higher mode are reduced or prevented when the acoustic velocity of the support substrate 2 is lower than or equal to about 5100 m/s.

Therefore, as shown in the following Table 4, when the acoustic velocity of the support substrate 2 is selected according to the film thickness of the silicon oxide film 3, both the first higher mode and the second higher mode are effectively reduced or prevented.

TABLE 4

| $SiO_2$ Film Thickness Range | Silicon Acoustic Velocity $V_{Si}$ |
| --- | --- |
| $0.00\lambda < SiO_2 \leq 0.12\lambda$ | Lower Than or Equal to 5300 m/s |
| $0.12\lambda < SiO_2 \leq 0.34\lambda$ | Lower Than or Equal to 5100 m/s |
| $0.34\lambda < SiO_2 \leq 0.44\lambda$ | Lower Than or Equal to 4900 m/s |
| $0.44\lambda < SiO_2 \leq 0.54\lambda$ | Lower Than or Equal to 4700 m/s |

From Table 4, when the acoustic velocity of the support substrate 2 is lower than or equal to about 4700 m/s, the first higher mode and the second higher mode are effectively reduced or prevented when the film thickness of the silicon oxide film 3 is less than or equal to about $0.54\lambda$ regardless of the film thickness of the silicon oxide film 3.

As described above, with the acoustic wave device 1 of the present preferred embodiment, at least the response of the first higher mode is effectively reduced or prevented.

In the present preferred embodiment, the one-port acoustic wave resonator is described as the acoustic wave device 1. However, the acoustic wave device of the present invention is not limited to the one-port acoustic wave resonator. The acoustic wave device of the present invention may be widely applied to acoustic wave devices having various electrode structures, such as a longitudinally coupled resonator acoustic wave filter.

The structures of acoustic wave devices and acoustic wave device packages according to second to seventh preferred embodiments of the present invention will be described with reference to FIG. 14 to FIG. 20.

Figure 14:
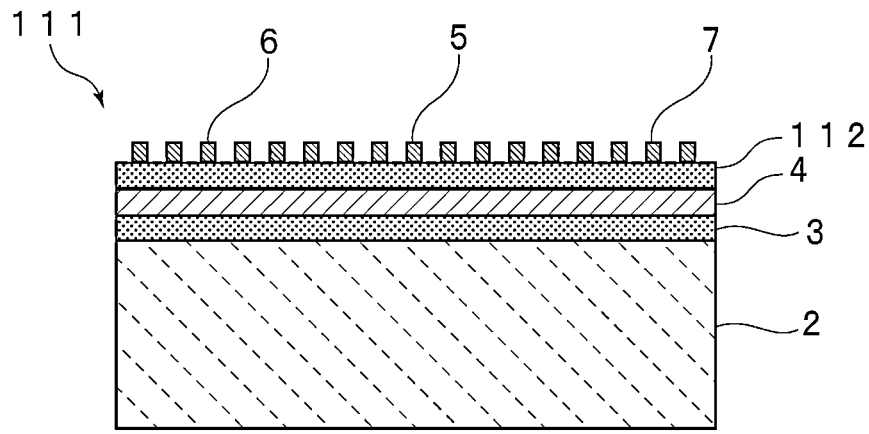
FIG. 14 is a front cross-sectional view of an acoustic wave device according to a second preferred embodiment of the present invention.

FIG. 14 is a front cross-sectional view of the acoustic wave device according to a second preferred embodiment of the present invention. In the acoustic wave device 111 according to the second preferred embodiment, a dielectric layer 112 is provided between the piezoelectric body 4 and the interdigital transducer electrode 5. In the other points, the acoustic wave device 111 is the same as or similar to the acoustic wave device 1. In this manner, the dielectric layer 112 may be provided between the interdigital transducer electrode 5 and the piezoelectric body 4. Examples of the dielectric layer 112 include tantalum pentoxide and silicon oxide.

Figure 15:
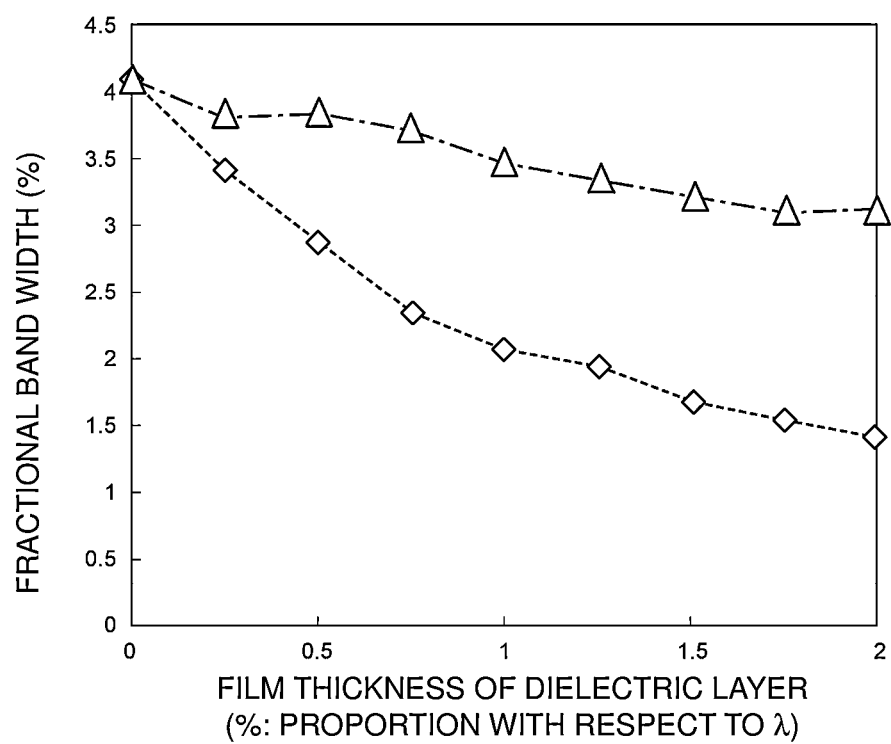
FIG. 15 is a graph that shows the relationship between the film thickness of a dielectric layer and a fractional band width.

FIG. 15 is a graph that shows the relationship between the film thickness of the dielectric film and a fractional band width in each of the case where the dielectric layer made of tantalum pentoxide is provided and the case where the dielectric layer made of silicon oxide is provided. The results in the case where tantalum pentoxide is used as the dielectric layer are represented by triangles. The results in the case where silicon oxide is used as the dielectric film are represented by diamonds.

As is apparent from FIG. 15, it is discovered that, when tantalum pentoxide or silicon oxide is used, the fractional band width can be controlled by adjusting the film thickness of the dielectric layer.

In preferred embodiments of the present invention, the piezoelectric body is not limited to $LiTaO_3$. Another piezoelectric monocrystal, such as $LiNbO_3$, a piezoelectric thin film, such as ZnO and AlN, or piezoelectric ceramics, such as PZT, for example, may be used as the piezoelectric body.

Figure 16:
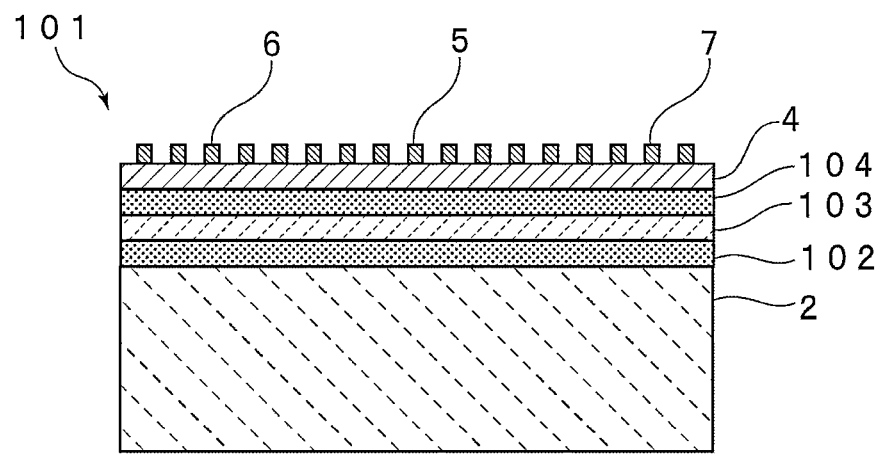
FIG. 16 is a front cross-sectional view of an acoustic wave device according to a third preferred embodiment of the present invention.

FIG. 16 is a front cross-sectional view of an acoustic wave device 101 according to a third preferred embodiment of the present invention.

In the acoustic wave device 101, a low acoustic velocity material layer 102, a high acoustic velocity material layer 103, and a silicon oxide film 104 are laminated on the support substrate in this order. The acoustic velocity of bulk waves that propagate through the silicon oxide film 104 is lower than the acoustic velocity of acoustic waves that propagate through the piezoelectric body 4. Therefore, the silicon oxide film 104 is also a low acoustic velocity material layer. The piezoelectric body 4 is laminated on the silicon oxide film 104.

Similar to the acoustic wave device 101, the low acoustic velocity material layer 102 and the high acoustic velocity material layer 103, other than the silicon oxide film 104, may be laminated between the support substrate 2 and the piezoelectric body 4. Here, the low acoustic velocity material layer 102 is preferably made of a low acoustic velocity material. The low acoustic velocity material is a material whose acoustic velocity at which bulk waves propagate through the material is lower than the acoustic velocity of acoustic waves that propagate through a piezoelectric body such as the piezoelectric body 4. The high acoustic velocity material layer 103 is preferably made of a high acoustic velocity material. The high acoustic velocity material is a material whose acoustic velocity at which bulk waves propagate through the material is higher than the acoustic velocity of acoustic waves that propagate through a piezoelectric body such as the piezoelectric body 4. Examples of the low acoustic velocity material include a dielectric, such as silicon oxide, including $SiO_2$, and tantalum pentoxide, glass, silicon oxynitride, tantalum oxide, and a medium containing at least one of the above materials as a main ingredient, such as a chemical compound obtained by adding fluorine, carbon, or boron to silicon oxide. Examples of the high acoustic velocity material include, other than metals or silicon, various materials, such as aluminum nitride, aluminum oxide, silicon carbide, silicon nitride, silicon oxynitride, sapphire, lithium tantalate, lithium niobate, quartz crystal, alumina, zirconia, cordierite, mullite, steatite, forsterite, magnesia, a DLC film, diamond, a medium containing at least one of the materials as a main ingredient, and a medium containing a mixture of some of the materials as main ingredients. Preferably, silicon oxide or tantalum pentoxide, for example, is used as the dielectric that defines and functions as the low acoustic velocity material layer. More preferably, silicon oxide is used. In this case, the frequency-temperature characteristics are also improved.

Preferably, at least one low acoustic velocity material layer is disposed between the at least one high acoustic velocity material layer 103 and a piezoelectric body such as the piezoelectric body 4. With this configuration, acoustic waves are effectively enclosed in the piezoelectric body. The support substrate 2 is preferably made of a high acoustic velocity material. Therefore, as in the case of the first preferred embodiment, the structure in which the silicon oxide film 3 is laminated on the support substrate 2 is a configuration in which a low acoustic velocity material layer is located between the high acoustic velocity material and the piezoelectric body. Therefore, with the acoustic wave device 101 as well, the energy of acoustic waves is effectively enclosed in the piezoelectric body 4.

Figure 17:
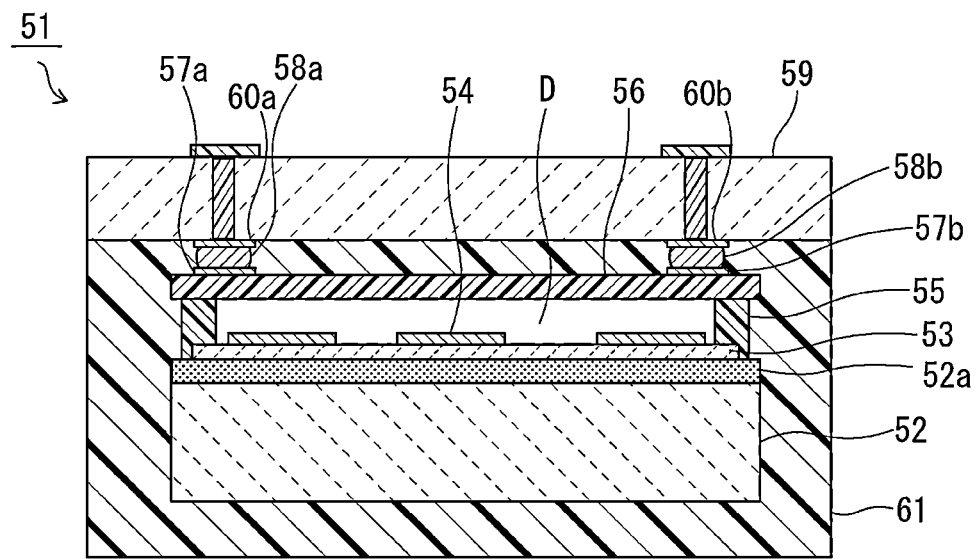
FIG. 17 is a front cross-sectional view of an acoustic wave device package according to a fourth preferred embodiment of the present invention.

As shown in FIG. 17, an acoustic wave device package 51 of a fourth preferred embodiment of the present invention includes a support substrate 52, a silicon oxide film 52a, a piezoelectric body 53, and an interdigital transducer electrode 54. The silicon oxide film 52a, the piezoelectric body 53, and the interdigital transducer electrode 54 are laminated on the support substrate 52. A support layer 55 preferably made of a resin, for example, surrounds the interdigital transducer electrode 54. A cover member 56 is joined onto the support layer 55. Thus, a hollow space D is provided. Terminal electrodes 57a, 57b and metal bumps 58a, 58b are provided on the cover member 56. An element portion having a WLP structure is a portion in which the piezoelectric body 53, the interdigital transducer electrode 54, the support layer 55, the cover member 56, the terminal electrodes 57a, 57b, and the metal bumps 58a, 58b are provided on the support substrate 52. The metal bumps 58a, 58b are electrically connected to terminal electrodes 60a, 60b that define and function as electrode lands of a case substrate 59. The entire element portion having the WLP structure is sealed by a sealing resin layer 61.

Figure 18:
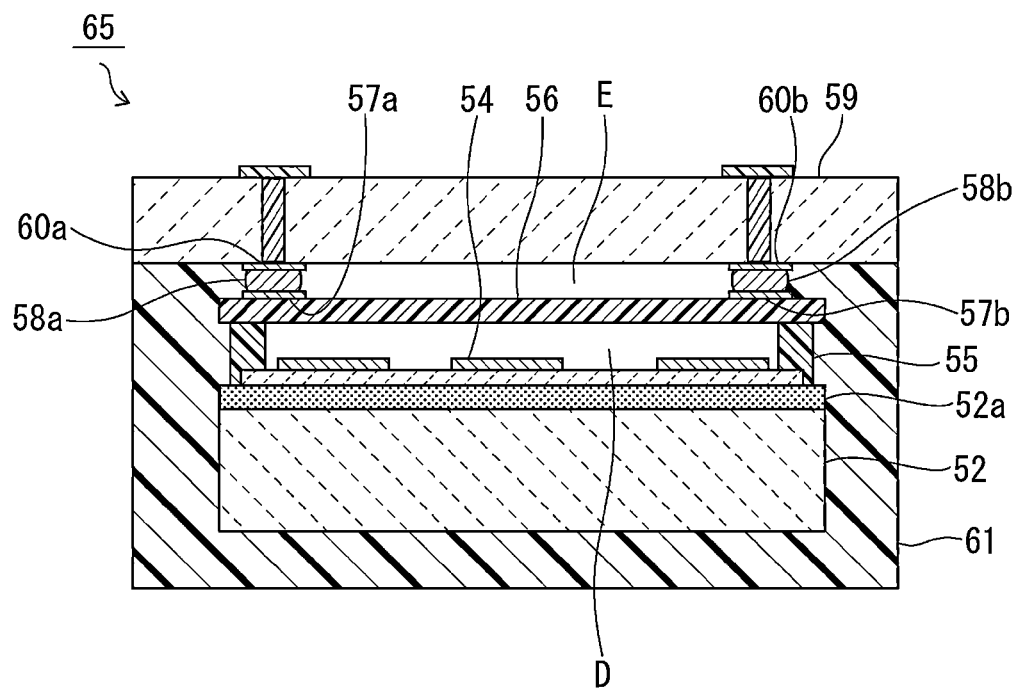
FIG. 18 is a front cross-sectional view of an acoustic wave device package according to a fifth preferred embodiment of the present invention.

In an acoustic wave device package 65 according to a fifth preferred embodiment of the present invention shown in FIG. 18, the sealing resin layer 61 does not extend to a space E between the metal bump 58a and the metal bump 58b. In the other points, the acoustic wave device package 65 is the same as or similar to the acoustic wave device package 51. In this case, when the metal bumps 58a, 58b are made of Au, for example, it is more preferable because thermal shock resistance improves.

Figure 19:
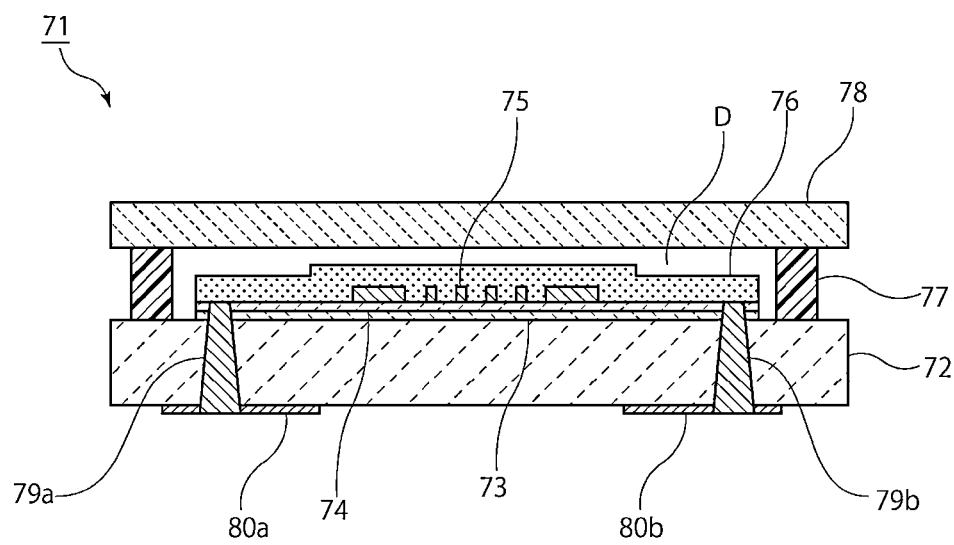
FIG. 19 is a front cross-sectional view of an acoustic wave device according to a sixth preferred embodiment of the present invention.

In an acoustic wave device 71 according to a sixth preferred embodiment of the present invention shown in FIG. 19, a silicon oxide film 73 and a piezoelectric body 74 are laminated on a support substrate 72 in this order. An interdigital transducer electrode 75 is provided on the piezoelectric body 74. A dielectric layer 76 covers the interdigital transducer electrode 75. In this manner, the dielectric layer 76 may be further provided so as to cover the interdigital transducer electrode 75. A dielectric material for such the dielectric layer 76 is not specifically limited. For example, silicon oxide, or the like, may preferably be used.

A support layer 77 surrounds the interdigital transducer electrode 75. A cover member 78 is joined onto the support layer 77. Thus, the hollow space D is provided. Via electrodes 79a, 79b that define and function as through vias are provided so as to extend through the support substrate 72, the silicon oxide film 73, and the piezoelectric body 74. The via electrodes 79a, 79b are electrically connected to the interdigital transducer electrode 75. Terminal electrodes 80a, 80b are provided on the bottom surface of the support substrate 72. The via electrodes 79a, 79b are electrically connected to the terminal electrodes 80a, 80b. In this manner, electrical connection with an external device may be provided by using the via electrodes 79a, 79b that extend through the support substrate 72. The number of the via electrodes and the number of the terminal electrodes respectively may be one, such that the via electrode and the terminal electrode are electrically connected to each other.

Figure 20:
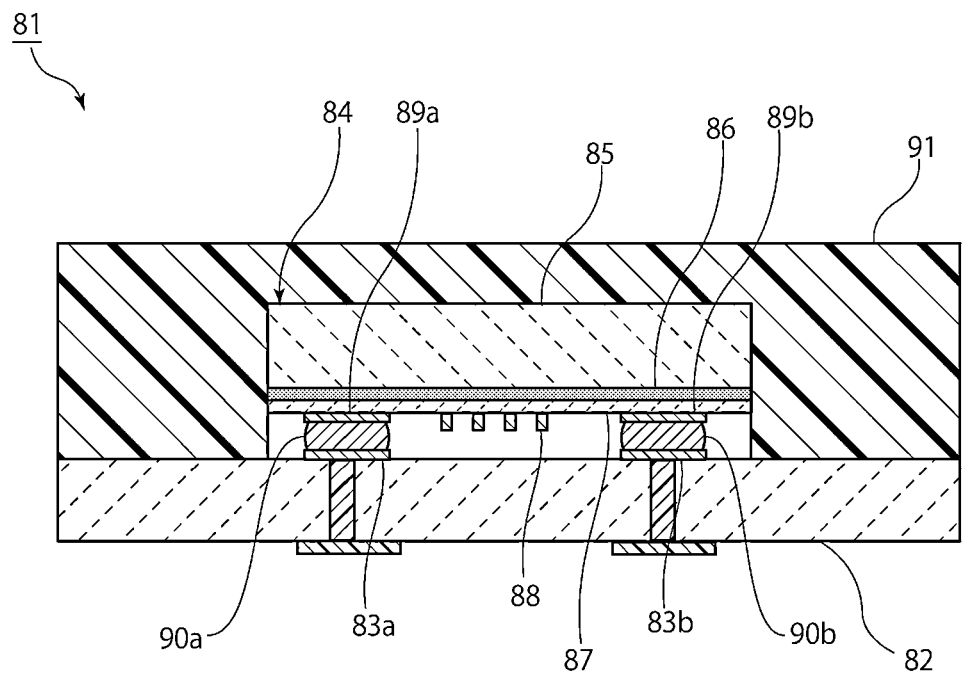
FIG. 20 is a front cross-sectional view of an acoustic wave device package according to a seventh preferred embodiment of the present invention.

As shown in FIG. 20, in an acoustic wave device package according to a seventh preferred embodiment of the present invention, terminal electrodes 83a, 83b are provided on one of the surfaces of a case substrate 82. An acoustic wave device 84 is mounted on the case substrate 82. The acoustic wave device 84 has a structure in which a silicon oxide film 86, a piezoelectric body 87, and an interdigital transducer electrode 88 are laminated on a support substrate 85 in this order. Terminal electrodes 89a, 89b are provided on the piezoelectric body 87. Metal bumps 90a, 90b are provided on the terminal electrodes 89a, 89b. The metal bumps 90a, 90b are joined with the terminal electrodes 83a, 83b. A sealing resin layer 91 covers the acoustic wave device 84. In this case, when the metal bumps 90a, 90b are made of Au, for example, it is more preferable because heat shock resistance improves. The number of the metal bumps and the number of the terminal electrodes respectively may be one, such that the metal bump and the terminal electrode are joined with each other.

A first higher mode that propagates through a piezoelectric film can be identified by simulations of a finite element method, for example. Specifically, parameters, that is, the film thickness of an interdigital transducer electrode, the material of the interdigital transducer electrode, the film thickness of the piezoelectric film, the material of the piezoelectric film, the film thickness of each of intermediate layers such as a low acoustic velocity film and a high acoustic velocity film, the material of each of the intermediate layers, the thickness of a support substrate, and the crystal orientation of the support substrate, are identified. After that, harmonic vibration analysis is performed by using the parameters with the use of simulation software (FEMTET).

Through harmonic vibration analysis, an impedance at each frequency is obtained.

The pass band of a filter is identified by measuring an insertion loss of the filter with a network analyzer. Therefore, from the results of the harmonic vibration analysis, one or more resonant frequencies at which the impedance is a minimum value and one or more anti-resonant frequencies at which the impedance is a maximum value are identified. From among these, the mode of waves having the greatest difference between the impedance at the resonant frequency and the impedance at the anti-resonant frequency is identified. The mode of the waves is a main mode that propagates through the piezoelectric film. It is also found from the result of harmonic vibration analysis whether there is at least one of the resonant frequency and the anti-resonant frequency in the pass band of the filter.

When the acoustic wave device is a resonator, the main mode is a mode of which at least one of the resonant frequency and the anti-resonant frequency lies in the pass band of the filter and waves have the greatest difference between the impedance at the resonant frequency and the impedance at the anti-resonant frequency. In addition, when the acoustic wave device is a filter, the main mode is a mode of which waves are used to provide the pass band of the filter.

From the main mode, a first higher mode (a mode that is generated on a higher frequency side than the main mode and whose waves are closest to the main mode) that propagate through the piezoelectric film is identified.

The acoustic velocity of the first higher mode that propagates through the piezoelectric film is an acoustic velocity of the first higher mode that propagates through the piezoelectric film at the anti-resonant frequency.

Since V=f×λ, the acoustic velocity V of the first higher mode that propagates through the piezoelectric film can be calculated from the anti-resonant frequency f of the first higher mode that propagates through the piezoelectric film and X that is a value twice as large as the electrode finger pitch of the interdigital transducer electrode.

The acoustic wave device may be used, for example, as a duplexer of a radio-frequency front-end circuit, or another device. This example will be described below.

Figure 21:
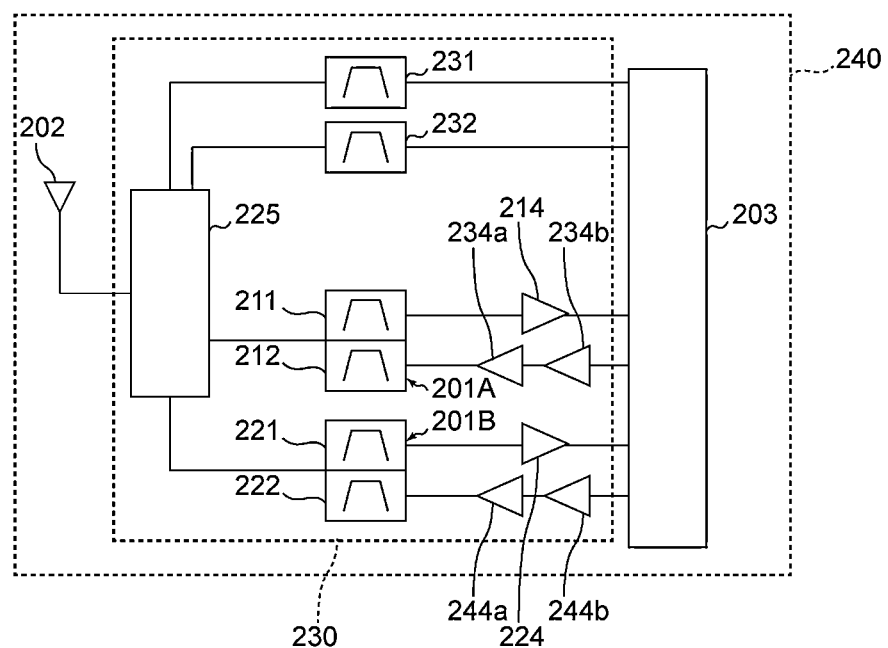
FIG. 21 is a configuration diagram of a communication device including a radio-frequency front-end circuit according to a preferred embodiment of the present invention.

FIG. 21 is a configuration view of a communication device including a radio-frequency front-end circuit. The diagram shows the radio-frequency front-end circuit 230 and components connected to the radio-frequency front-end circuit 230. Examples of the illustrated components connected to the radio-frequency front-end circuit 230 include an antenna element 202 and an RF signal processing circuit (RFIC) 203. The radio-frequency front-end circuit 230 and the RF signal processing circuit 203 define the communication device 240. The communication device 240 may include a power supply, a CPU, or a display, for example.

The radio-frequency front-end circuit 230 includes a switch 225, duplexers 201A, 201B, low-noise amplifier circuits 214, 224, filters 231, 232, and power amplifier circuits 234a, 234b, 244a, 244b. The radio-frequency front-end circuit 230 and the communication device 240 in FIG. 21 are examples of the radio-frequency front-end circuit and the communication device, and the radio-frequency front-end circuit and the communication device are not limited to these configurations.

The duplexer 201A includes filters 211, 212. The duplexer 201B includes filters 221, 222. The duplexers 201A, 201B are connected to the antenna element 202 via the switch 225. The acoustic wave device may be the duplexer 201A or the duplexer 201B or may be the filter 211, the filter 212, the filter 221, or the filter 222. The acoustic wave device may be an acoustic wave resonator that is a component of the duplexer 201A, the duplexer 201B, the filter 211, the filter 212, the filter 221, or the filter 222. Furthermore, the acoustic wave device may be applied to a configuration including three or more filters, such as a triplexer having a common antenna terminal for three filters and a hexaplexer having a common antenna terminal for six filters.

In other words, the acoustic wave devices according to preferred embodiments of the present invention include an acoustic wave resonator, a filter, and a multiplexer including two or more filters, for example.

The switch 225 connects the antenna element 202 to a signal path that supports a predetermined band in accordance with a control signal from a control unit (not shown). The switch 225 is preferably, for example, an SPDT (single pole double throw) switch. The signal path to be connected to the antenna element 202 is not limited to one and may be multiple signal paths. In other words, the radio-frequency front-end circuit 230 may support carrier aggregation.

The low-noise amplifier circuit 214 is a receiving amplifier circuit that amplifies a radio-frequency signal (here, radio-frequency reception signal) via the antenna element 202, the switch 225, and the duplexer 201A and that outputs the amplified radio-frequency signal to the RF signal processing circuit 203. The low-noise amplifier circuit 224 is a receiving amplifier circuit that amplifies a radio-frequency signal (here, radio-frequency reception signal) via the antenna element 202, the switch 225, and the duplexer 201B and that outputs the amplified radio-frequency signal to the RF signal processing circuit 203.

The power amplifier circuits 234a, 234b each are a transmission amplifier circuit that amplifies a radio-frequency signal (here, radio-frequency transmission signal) output from the RF signal processing circuit 203 and that outputs the radio-frequency signal to the antenna element 202 via the duplexer 201A and the switch 225. The power amplifier circuits 244a, 244b each are a transmission amplifier circuit that amplifies a radio-frequency signal (here, radio-frequency transmission signal) output from the RF signal processing circuit 203 and that outputs the radio-frequency signal to the antenna element 202 via the duplexer 201B and the switch 225.

The filters 231, 232 are connected between the RF signal processing circuit 203 and the switch 225 without intervening the low-noise amplifier circuit or the power amplifier circuit. The filters 231, 232, as well as the duplexers 201A, 201B, are connected to the antenna element 202 via the switch 225.

The RF signal processing circuit 203 processes a radio-frequency reception signal input from the antenna element 202 via a reception signal path by down conversion, or the like, and outputs the processed and generated reception signal. The RF signal processing circuit 203 processes an input transmission signal by up conversion, or the like, and outputs the processed and generated radio-frequency transmission signal to the power amplifier circuits 244a, 244b. The RF signal processing circuit 203 is preferably, for example, an RFIC. The communication device may include a BB (baseband) IC. In this case, the BBIC processes a reception signal processed by the RFIC. The BBIC processes a transmission signal and outputs the processed transmission signal to the RFIC. A reception signal processed by the BBIC or a transmission signal before being processed by the BBIC is, for example, an image signal, an audio signal, or the like. The radio-frequency front-end circuit 230 may include another circuit element between the above-described components.

The radio-frequency front-end circuit 230 may include duplexers according to a modification of the duplexers 201A, 201B in place of the duplexers 201A, 201B.

The acoustic wave devices, radio-frequency front-end circuits, and communication devices according to the preferred embodiments of the present invention are described by way of the above-described preferred embodiments. However, the present invention also encompasses other preferred embodiments provided by combining selected elements of the above-described preferred embodiments, modifications obtained by applying various alterations that are conceived of by persons skilled in the art to the above-described preferred embodiments without departing from the scope of the present invention, and various devices that include the radio-frequency front-end circuits or communication devices according to preferred embodiments of the present invention.

Preferred embodiments of the present invention are widely usable in an acoustic wave resonator, a filter, a multiplexer including two or more filters, a radio-frequency front-end circuit, and a communication device, such as a cellular phone, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate made of silicon;
a silicon oxide film provided on or above the support substrate;
a piezoelectric body provided on or above the silicon oxide film; and
an interdigital transducer electrode provided on or above one of main surfaces of the piezoelectric body; wherein
where a wavelength that is determined by an electrode finger pitch of the interdigital transducer electrode is $\lambda$, a thickness of the support substrate is greater than or equal to about $3\lambda$; and
an acoustic velocity of a mode that is generated on a higher frequency side than a main mode and whose waves are closest to the main mode that propagates through the piezoelectric body is equal to an acoustic velocity $V_{Si}$ of mathematical expression (1) below, which is an acoustic velocity of bulk waves that propagate in the support substrate, or higher than the acoustic velocity $V_{Si}$, $$V_{Si} = (V_1)^{1/2} \text{ (m/s)} \quad \text{mathematical expression (1)}$$

where $V_1$ in the mathematical expression (1) is a solution to the following mathematical expression (2), $$Ax^3 + Bx^2 + Cx + D = 0 \quad \text{mathematical expression (2)}$$

where, in the mathematical expression (2), A, B, C, and D are respectively values expressed by the following mathematical expressions (2A) to (2D), $$A = -\rho^3 \quad \text{mathematical expression (2A)}$$

$$B = \rho^2(L_{11} + L_{22} + L_{33}) \quad \text{mathematical expression (2B)}$$

$$C = \rho(L_{21}^2 + L_{23}^2 + L_{31}^2 - L_{11} \cdot L_{33} - L_{22} \cdot L_{33} - L_{11} \cdot L_{22}) \quad \text{mathematical expression (2C)}$$

$$D = 2 \cdot L_{21} \cdot L_{23} L_{31} + L_{11} \cdot L_{22} \cdot L_{33} - L_{31}^2 \cdot L_{22} - L_{11} \cdot L_{23}^2 - L_{21}^2 L_{33} \quad \text{mathematical expression (2D)}$$

where, in the mathematical expression (2A), the mathematical expression (2B), the mathematical expression (2C), or the mathematical expression (2D), $\rho = 2.331$ (g/cm$^3$), and $L_{11}$, $L_{22}$, $L_{33}$, $L_{21}$, $L_{31}$, and $L_{23}$ are values expressed by the following mathematical expressions (3A) to (3F), $$L_{11} = c_{11} \cdot a_1^2 + c_{44} \cdot a_2^2 + c_{44} \cdot a_3^2 \quad \text{mathematical expression (3A)}$$

$$L_{22} = c_{44} \cdot a_1^2 + c_{11} \cdot a_2^2 + c_{44} \cdot a_3^2 \quad \text{mathematical expression (3B)}$$

$$L_{33} = c_{44} \cdot a_1^2 + c_{44} \cdot a_2^2 + c_{11} \cdot a_3^2 \quad \text{mathematical expression (3C)}$$

$$L_{21} = (c_{12} + c_{44}) \cdot a_2 \cdot a_1 \quad \text{mathematical expression (3D)}$$

$$L_{31} = (c_{12} + c_{44}) \cdot a_1 \cdot a_3 \quad \text{mathematical expression (3E)}$$

$$L_{23} = (c_{44} + c_{12}) \cdot a_3 \cdot a_2 \quad \text{mathematical expression (3F)}$$

where, in the mathematical expressions (3A) to (3F), $c_{11}$ is about 1.674E+11 (N/m$^2$), $c_{12}$ is about 6.523E+10 (N/m$^2$), and $c_{44}$ is about 7.957E+10 (N/m$^2$), and $a_1$, $a_2$, and $a_3$ are values expressed by the following mathematical expressions (4A) to (4C), $$a_1 = \cos(\phi) \cdot \cos(\psi) - \sin(\phi) \cdot \cos(\theta) \cdot \sin(\psi) \quad \text{mathematical expression (4A)}$$

$$a_2 = \sin(\phi) \cdot \cos(\psi) + \cos(\phi) \cdot \cos(\theta) \cdot \sin(\psi) \quad \text{mathematical expression (4B)}$$

$$a_3 = \sin(\theta) \cdot \sin(\psi) \quad \text{mathematical expression (4C)}$$

where $\phi$, $\theta$, and $\psi$ in the mathematical expressions (4A) to (4C) are $\phi$, $\theta$, and $\psi$ in a crystal orientation ($\phi$, $\theta$, $\psi$) of the support substrate.

2. The acoustic wave device according to claim 1, wherein the thickness of the support substrate is greater than or equal to about $20\lambda$.

3. The acoustic wave device according to claim 1, wherein a film thickness of the silicon oxide film falls within any one of ranges shown in Table 1 below:

TABLE 1

| SiO$_2$ Film Thickness Range | Silicon Acoustic Velocity $V_{Si}$ |
|---|---|
| $0.00\lambda < \text{SiO}_2 \leq 0.40\lambda$ | Lower Than or Equal to 5500 m/s |
| $0.40\lambda < \text{SiO}_2 \leq 0.64\lambda$ | Lower Than or Equal to 5300 m/s |
| $0.64\lambda < \text{SiO}_2 \leq 0.84\lambda$ | Lower Than or Equal to 5100 m/s |
| $0.84\lambda < \text{SiO}_2 \leq 1.04\lambda$ | Lower Than or Equal to 4900 m/s |
| $1.04\lambda < \text{SiO}_2 \leq 1.20\lambda$ | Lower Than or Equal to 4700 m/s. |

4. The acoustic wave device according to claim 3, further comprising a high acoustic velocity material layer between the silicon oxide film and the support substrate, an acoustic velocity of bulk waves that propagate through the high acoustic velocity material layer being higher than an acoustic velocity of acoustic waves that propagate through the piezoelectric body.

5. The acoustic wave device according to claim 1, wherein a film thickness of the silicon oxide film falls within any one of ranges shown in Table 2 below:

TABLE 2

| SiO$_2$ Film Thickness Range | Silicon Acoustic Velocity V$_{Si}$ |
|---|---|
| 0.00λ < SiO$_2$ ≤ 0.12λ | Lower Than or Equal to 5300 m/s |
| 0.12λ < SiO$_2$ ≤ 0.34λ | Lower Than or Equal to 5100 m/s |
| 0.34λ < SiO$_2$ ≤ 0.44λ | Lower Than or Equal to 4900 m/s |
| 0.44λ < SiO$_2$ ≤ 0.54λ | Lower Than or Equal to 4700 m/s. |

6. The acoustic wave device according to claim 1, wherein V$_1$ in the mathematical expression (1) is a minimum value among solutions V$_1$, V$_2$, and V$_3$ to the mathematical expression (2).

7. The acoustic wave device according to claim 1, wherein the acoustic velocity V$_{Si}$ of the support substrate is lower than or equal to about 4700 m/s.

8. The acoustic wave device according to claim 1, wherein a thickness of the support substrate is less than or equal to about 180 μm.

9. The acoustic wave device according to claim 1, wherein a film thickness of the piezoelectric body is less than or equal to about 3.5λ.

10. The acoustic wave device according to claim 1, wherein the piezoelectric body is made of LiTaO$_3$.

11. The acoustic wave device according to claim 1, wherein an acoustic velocity of bulk waves that propagate through the silicon oxide film is lower than an acoustic velocity of acoustic waves that propagate through the piezoelectric body.

12. The acoustic wave device according to claim 1, wherein the acoustic velocity of bulk waves that propagate through the support substrate is higher than an acoustic velocity of acoustic waves that propagate through the piezoelectric body.

13. The acoustic wave device according to claim 1, further comprising a dielectric layer provided between the piezoelectric body and the interdigital transducer electrode.

14. The acoustic wave device according to claim 13, wherein the dielectric layer is made of silicon oxide or tantalum pentoxide.

15. The acoustic wave device according to claim 1, further comprising:
 a support layer surrounding the interdigital transducer electrode;
 a cover member covering the support layer and providing a hollow space surrounding the interdigital transducer electrode; and
 a plurality of metal bumps provided on the cover member and electrically connected to the interdigital transducer electrode.

16. An acoustic wave device package comprising:
 the acoustic wave device according to claim 15; and
 a case substrate on one surface of which a plurality of electrode lands is provided; wherein
 the acoustic wave device is mounted on the case substrate such that the plurality of metal bumps are joined with the plurality of electrode lands of the case substrate; and
 the acoustic wave device package further includes a sealing resin layer provided so as to seal the acoustic wave device.

17. The acoustic wave device package according to claim 16, wherein a gap is provided between the cover member and the case substrate.

18. The acoustic wave device according to claim 1, further comprising:
 a support layer surrounding the interdigital transducer electrode; and
 a cover member covering the support layer and providing a hollow space surrounding the interdigital transducer electrode; wherein
 in the support substrate, at least one through via extending through the support substrate and at least one terminal electrode electrically connected to the at least one through via and provided on a surface on an opposite side of the support substrate from a side on which the interdigital transducer electrode is provided, are provided; and
 the at least one through via is electrically connected to the interdigital transducer electrode and the at least one terminal electrode.

19. An acoustic wave device package comprising:
 a case substrate on one surface of which a plurality of electrode lands is provided; and
 the acoustic wave device according to claim 1; wherein
 at least one metal bump electrically connected to the interdigital transducer electrode is provided in the acoustic wave device;
 the acoustic wave device is mounted on the case substrate such that the at least one metal bump of the acoustic wave device is joined with at least one of the electrode lands; and
 the acoustic wave device package further includes a sealing resin layer provided on the case substrate so as to seal the acoustic wave device.

* * * * *